(12) United States Patent
Watanabe et al.

(10) Patent No.: US 10,811,284 B2
(45) Date of Patent: Oct. 20, 2020

(54) SUBSTRATE PROCESSING METHOD AND APPARATUS

(71) Applicant: EBARA CORPORATION, Tokyo (JP)

(72) Inventors: Toshifumi Watanabe, Tokyo (JP); Satoru Yamamoto, Tokyo (JP); Yu Machida, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 2 days.

(21) Appl. No.: 15/933,237

(22) Filed: Mar. 22, 2018

(65) Prior Publication Data

US 2018/0277401 A1    Sep. 27, 2018

(30) Foreign Application Priority Data

Mar. 27, 2017 (JP) .................. 2017-060432

(51) Int. Cl.
| | |
|---|---|
| *H01L 21/67* | (2006.01) |
| *H01L 21/66* | (2006.01) |
| *H01L 21/02* | (2006.01) |
| *B24B 37/00* | (2012.01) |
| *B24B 21/00* | (2006.01) |
| *B24B 9/06* | (2006.01) |

(52) U.S. Cl.
CPC ........ *H01L 21/67051* (2013.01); *B24B 9/065* (2013.01); *B24B 21/002* (2013.01); *B24B 21/004* (2013.01); *B24B 21/008* (2013.01); *B24B 37/00* (2013.01); *H01L 21/02021* (2013.01); *H01L 21/02087* (2013.01); *H01L 21/67288* (2013.01); *H01L 22/12* (2013.01); *H01L 22/20* (2013.01)

(58) Field of Classification Search
None
See application file for complete search history.

(56) References Cited

U.S. PATENT DOCUMENTS 1,365,583 A * 1/1921 Brown .................. B24B 21/002
                                                         451/310
3,170,272 A * 2/1965 Burnham ................ B24B 21/16
                                                         451/59

(Continued)

FOREIGN PATENT DOCUMENTS

| JP | 2012-213849 A | 11/2012 |
|---|---|---|
| JP | 2013-004825 A | 1/2013 |

*Primary Examiner* — David E Graybill
(74) *Attorney, Agent, or Firm* — BakerHostetler

(57) ABSTRACT

A substrate processing method which can clean a peripheral portion of a substrate after polishing and can check the cleaning effect of the peripheral portion of the substrate is disclosed. The substrate processing method includes polishing a peripheral portion of the substrate by pressing a polishing tape having abrasive grains against the peripheral portion of the substrate with a first head, cleaning the peripheral portion of the substrate by supplying a cleaning liquid to the peripheral portion of the substrate after polishing, bringing a tape having no abrasive grains into contact with the peripheral portion of the substrate after cleaning by a second head, applying light to the tape and receiving reflected light from the tape by a sensor, and judging that the peripheral portion of the substrate is contaminated when an intensity of the received reflected light is lower than a predetermined value.

5 Claims, 13 Drawing Sheets

(56) References Cited

U.S. PATENT DOCUMENTS

| | | | | |
|---|---|---|---|---|
| 3,524,284 A | * | 8/1970 | Mears | B24B 21/00 451/303 |
| 3,596,413 A | * | 8/1971 | Stewart | B24B 53/007 451/444 |
| 3,715,839 A | * | 2/1973 | Heesemann | B24B 21/002 451/168 |
| 3,753,269 A | * | 8/1973 | Budman | B24B 21/18 15/160 |
| 3,922,820 A | * | 12/1975 | Wiltshire | B24B 21/002 451/304 |
| 4,031,668 A | * | 6/1977 | Lasko | B24B 21/16 451/303 |
| 4,109,422 A | * | 8/1978 | Parsons | B24B 21/18 451/56 |
| 4,209,366 A | * | 6/1980 | Leroy | C21D 1/70 205/138 |
| 4,231,193 A | * | 11/1980 | Siegel | B24B 21/00 451/303 |
| 4,344,260 A | * | 8/1982 | Ogiwara | B24B 9/065 148/33 |
| 4,514,937 A | * | 5/1985 | Gehrung | B24B 7/13 451/163 |
| 4,525,955 A | * | 7/1985 | Cothrell | B24B 53/10 451/296 |
| 4,719,721 A | * | 1/1988 | Stump | B24B 41/068 198/689.1 |
| 5,128,281 A | * | 7/1992 | Dyer | B24B 9/065 438/693 |
| 5,209,027 A | * | 5/1993 | Ishida | B24B 21/004 451/303 |
| 5,289,661 A | * | 3/1994 | Jones | B24B 9/065 451/258 |
| 5,431,592 A | * | 7/1995 | Nakata | B24B 21/20 451/296 |
| 5,509,850 A | * | 4/1996 | Morioka | B24B 9/065 451/168 |
| 5,514,025 A | * | 5/1996 | Hasegawa | B24B 9/065 451/260 |
| 5,593,344 A | * | 1/1997 | Weldon | B24B 21/06 451/296 |
| 5,609,514 A | * | 3/1997 | Yasunaga | B24B 9/065 451/44 |
| 5,643,044 A | * | 7/1997 | Lund | B24B 21/00 451/168 |
| 5,655,954 A | * | 8/1997 | Oishi | B08B 1/04 134/62 |
| 5,672,091 A | * | 9/1997 | Takahashi | B24B 37/013 451/287 |
| 5,713,784 A | * | 2/1998 | Miller | B24B 9/107 451/14 |
| 5,733,181 A | * | 3/1998 | Hasegawa | B24B 9/065 451/168 |
| 5,769,695 A | * | 6/1998 | Katayama | B24B 9/065 451/298 |
| 5,868,857 A | * | 2/1999 | Moinpour | B08B 1/008 134/6 |
| 5,885,138 A | * | 3/1999 | Okumura | B08B 1/04 451/285 |
| 5,895,314 A | * | 4/1999 | Kitao | B24B 9/148 451/43 |
| 5,928,060 A | * | 7/1999 | Miller | B24B 9/107 451/11 |
| 5,942,445 A | * | 8/1999 | Kato | C30B 33/00 257/E21.214 |
| 5,951,384 A | * | 9/1999 | Morioka | B24B 7/228 451/303 |
| 5,980,368 A | * | 11/1999 | Chang | B24B 21/04 451/303 |
| 6,000,996 A | * | 12/1999 | Fujiwara | B24B 37/013 451/6 |
| 6,062,955 A | * | 5/2000 | Liu | B24B 21/14 451/296 |
| 6,110,025 A | * | 8/2000 | Williams | B24B 49/16 451/286 |
| 6,110,391 A | * | 8/2000 | Takei | H01L 21/76251 216/2 |
| 6,132,289 A | * | 10/2000 | Labunsky | B24B 37/345 451/288 |
| 6,162,730 A | * | 12/2000 | Kai | B24B 37/042 257/E21.214 |
| 6,165,061 A | * | 12/2000 | Fujii | B24B 19/226 451/533 |
| 6,174,222 B1 | * | 1/2001 | Sato | B24B 9/065 451/44 |
| 6,193,590 B1 | * | 2/2001 | Weiss | B24B 21/06 451/163 |
| 6,227,950 B1 | * | 5/2001 | Hempel | B24B 37/20 451/288 |
| 6,237,585 B1 | * | 5/2001 | Oishi | B23D 57/0069 125/16.02 |
| 6,290,573 B1 | * | 9/2001 | Suzuki | B24B 21/06 451/307 |
| 6,302,769 B1 | * | 10/2001 | Nishi | B24B 9/065 257/E21.237 |
| 6,306,014 B1 | * | 10/2001 | Walker | B24B 21/04 451/296 |
| 6,311,702 B1 | * | 11/2001 | Fishkin | H01L 21/67051 134/1.3 |
| 6,319,105 B1 | * | 11/2001 | Togawa | B24B 53/017 134/153 |
| 6,332,828 B1 | * | 12/2001 | Hasegawa | B24B 9/065 451/44 |
| 6,336,057 B1 | * | 1/2002 | Obayashi | B24B 9/148 451/43 |
| 6,342,099 B1 | * | 1/2002 | Hiew | C09C 1/3661 106/438 |
| 6,370,350 B2 | * | 4/2002 | Tomita | G03G 15/0928 399/265 |
| 6,402,596 B1 | * | 6/2002 | Hakomori | B24B 9/065 451/168 |
| 6,425,801 B1 | * | 7/2002 | Takeishi | B24B 37/013 451/285 |
| 6,439,967 B2 | * | 8/2002 | Carpenter | B24B 13/012 451/41 |
| 6,447,374 B1 | * | 9/2002 | Sommer | B24B 21/04 451/41 |
| 6,458,021 B1 | * | 10/2002 | Takeyama | B24B 21/004 451/302 |
| 6,475,293 B1 | * | 11/2002 | Moinpour | B08B 1/008 134/6 |
| 6,476,393 B1 | * | 11/2002 | Yoshida | G01J 3/02 250/339.11 |
| 6,485,355 B1 | * | 11/2002 | Economikos | B24B 37/042 257/E21.244 |
| 6,491,836 B1 | * | 12/2002 | Kato | B24B 7/228 216/88 |
| 6,500,051 B1 | * | 12/2002 | Nishi | B08B 1/04 451/41 |
| 6,530,826 B2 | * | 3/2003 | Wenski | H01L 21/02024 257/E21.23 |
| 6,533,644 B1 | * | 3/2003 | Horie | B24B 7/228 428/141 |
| 6,558,239 B2 | * | 5/2003 | Kunisawa | B24B 9/065 451/303 |
| 6,604,985 B2 | * | 8/2003 | Muilenburg | B24B 37/013 451/10 |
| 6,621,584 B2 | * | 9/2003 | Pecen | B24B 37/205 356/630 |
| 6,629,875 B2 | * | 10/2003 | Steere, III | B24B 9/065 451/297 |
| 6,641,464 B1 | * | 11/2003 | Steere, III | B24B 9/065 451/287 |
| 6,670,089 B2 | * | 12/2003 | Ehara | G03G 5/08214 399/159 |
| 6,685,539 B1 | * | 2/2004 | Enomoto | B24B 7/228 257/E21.237 |
| 6,705,929 B1 | * | 3/2004 | Nishimoto | B08B 3/024 451/283 |

(56) References Cited

U.S. PATENT DOCUMENTS

| | | | | |
|---|---|---|---|---|
| 6,849,369 | B2* | 2/2005 | Yagi | G03G 9/0819 430/108.1 |
| 6,878,630 | B2* | 4/2005 | Bang | H01L 21/02008 257/E21.214 |
| 6,913,520 | B1* | 7/2005 | Liao | B24B 37/042 451/41 |
| 6,933,234 | B2* | 8/2005 | Nakamura | B24B 9/065 134/1.3 |
| 6,951,511 | B2* | 10/2005 | Gurusamy | B24B 21/20 451/168 |
| 6,960,115 | B2* | 11/2005 | Weldon | B24B 37/013 451/41 |
| 6,994,611 | B2* | 2/2006 | Svirchevski | B24B 37/042 134/2 |
| 7,014,529 | B1* | 3/2006 | Kubota | B24B 9/065 451/168 |
| 7,018,275 | B2* | 3/2006 | Zuniga | B24B 37/013 451/11 |
| 7,066,787 | B2* | 6/2006 | Nakanishi | B24B 9/065 451/297 |
| 7,074,535 | B2* | 7/2006 | Saito | G03G 9/0804 399/252 |
| 7,077,733 | B1* | 7/2006 | Taylor | B24B 37/042 451/303 |
| 7,108,582 | B2* | 9/2006 | Sato | B24B 9/065 451/11 |
| 7,198,874 | B2* | 4/2007 | Saito | G03G 9/0804 430/108.11 |
| 7,252,575 | B2* | 8/2007 | Kobayashi | B24B 49/12 451/41 |
| 7,351,131 | B2* | 4/2008 | Nakamura | B24B 9/065 257/E21.237 |
| 7,367,873 | B2* | 5/2008 | Ishii | B24B 9/065 451/168 |
| 7,386,944 | B2* | 6/2008 | Yi | H01L 21/67028 134/102.2 |
| 7,503,831 | B2* | 3/2009 | Radkevich | B23D 57/0061 125/16.02 |
| 7,507,146 | B2* | 3/2009 | Kato | B24B 9/065 257/E21.214 |
| 7,621,799 | B2* | 11/2009 | Sakairi | H01L 21/02024 451/299 |
| 7,682,225 | B2* | 3/2010 | Hongo | B24B 9/065 451/168 |
| 7,744,445 | B2* | 6/2010 | Kubota | B24B 9/065 451/303 |
| 7,758,404 | B1* | 7/2010 | Ryder | B24B 29/04 15/102 |
| 7,862,402 | B2* | 1/2011 | Hongo | B24B 9/065 451/168 |
| 7,976,361 | B2* | 7/2011 | Takahashi | B24B 9/065 451/303 |
| 7,993,485 | B2* | 8/2011 | Wasinger | B24B 1/04 156/345.12 |
| 8,029,333 | B2* | 10/2011 | Takahashi | B24B 21/16 451/11 |
| 8,038,508 | B2* | 10/2011 | Lim | B24B 9/065 451/10 |
| 8,041,281 | B2* | 10/2011 | Sugimoto | G03G 21/0035 399/343 |
| 8,047,896 | B2* | 11/2011 | Takahashi | B24B 21/004 451/311 |
| 8,125,654 | B2* | 2/2012 | Benvegnu | B24B 37/013 356/630 |
| 8,142,260 | B2* | 3/2012 | Kollata | H01L 21/02087 451/168 |
| 8,152,598 | B2* | 4/2012 | Fukushima | B24B 21/002 451/11 |
| 8,162,724 | B2* | 4/2012 | Yamauchi | B24B 29/02 451/178 |
| 8,187,055 | B2* | 5/2012 | Takahashi | B24B 9/065 451/9 |
| 8,210,905 | B2* | 7/2012 | Sakairi | B24B 9/065 451/168 |
| 8,267,741 | B2* | 9/2012 | Kimura | B24B 37/005 451/268 |
| 8,356,951 | B2* | 1/2013 | Noda | H01L 21/67253 396/611 |
| 8,376,811 | B2* | 2/2013 | Schwandner | B24B 7/228 451/190 |
| 8,393,935 | B2* | 3/2013 | Kimura | B24B 9/065 451/168 |
| 8,403,727 | B1* | 3/2013 | Redeker | B24B 37/042 451/41 |
| 8,414,355 | B2* | 4/2013 | Kimba | B24B 9/065 356/124 |
| 8,433,224 | B2* | 4/2013 | Fujiwara | G03G 15/0822 399/254 |
| 8,445,360 | B2* | 5/2013 | Nakanishi | B24B 9/065 257/E21.23 |
| 8,535,117 | B2* | 9/2013 | Nakanishi | B24B 21/002 451/168 |
| 8,540,551 | B2* | 9/2013 | Brown | B24B 9/102 451/168 |
| 8,545,119 | B2* | 10/2013 | Ookouchi | H01L 21/67051 15/97.1 |
| 8,558,193 | B2* | 10/2013 | Maeda | G01N 23/2251 250/306 |
| 8,563,335 | B1* | 10/2013 | Benvegnu | H01L 22/12 438/16 |
| 8,641,480 | B2* | 2/2014 | Nakanishi | B24B 1/00 451/168 |
| 8,748,289 | B2* | 6/2014 | Nakanishi | B24B 9/065 257/E21.23 |
| 8,771,038 | B2* | 7/2014 | Kimba | B24B 9/065 451/173 |
| 8,814,635 | B2* | 8/2014 | Hosokai | B24B 9/065 451/303 |
| 8,821,218 | B2* | 9/2014 | Luu | G11B 5/8408 451/168 |
| 8,860,932 | B2* | 10/2014 | Zhang | B24B 37/013 356/300 |
| 8,926,402 | B2* | 1/2015 | Nakanishi | B24B 21/002 451/296 |
| 8,952,496 | B2* | 2/2015 | Masuda | H01L 21/67046 414/222.04 |
| 8,956,202 | B2* | 2/2015 | Tassetti | B24B 9/085 451/168 |
| 8,979,615 | B2* | 3/2015 | Seki | B24B 9/065 451/168 |
| 8,986,069 | B2* | 3/2015 | Takahashi | B24B 9/065 451/9 |
| 9,008,817 | B2* | 4/2015 | Amano | H01L 21/67046 414/222.04 |
| 9,073,103 | B2* | 7/2015 | Morita | B08B 15/002 |
| 9,073,169 | B2* | 7/2015 | Xu | B24B 37/005 |
| 9,138,854 | B2* | 9/2015 | Maeda | B24B 21/004 |
| 9,144,881 | B2* | 9/2015 | Nakao | B24B 37/345 |
| 9,162,337 | B2* | 10/2015 | Ishibashi | B24B 1/04 |
| 9,199,352 | B2* | 12/2015 | Seki | B24B 9/065 |
| 9,248,543 | B2* | 2/2016 | Togawa | B24B 37/005 |
| 9,248,545 | B2* | 2/2016 | Seki | B24B 37/10 |
| 9,257,313 | B2* | 2/2016 | Amano | H01L 21/67051 |
| 9,287,127 | B2* | 3/2016 | Lee | H01L 21/02057 |
| 9,287,158 | B2* | 3/2016 | Takahashi | B24B 9/065 |
| 9,289,875 | B2* | 3/2016 | David | B24B 49/12 |
| 9,296,082 | B1* | 3/2016 | Kesvanathan | B24B 21/08 |
| 9,339,912 | B2* | 5/2016 | Chang | B24B 9/065 |
| 9,360,789 | B1* | 6/2016 | Masu | G03G 15/0233 |
| 9,399,274 | B2* | 7/2016 | Togawa | B24B 21/008 |
| 9,421,662 | B2* | 8/2016 | Lee | B24B 37/02 |
| 9,457,447 | B2* | 10/2016 | Seki | B24B 21/002 |
| 9,457,448 | B2* | 10/2016 | Seki | B24B 21/004 |
| 9,466,512 | B2* | 10/2016 | Ishibashi | H01L 21/67046 |
| 9,496,129 | B2* | 11/2016 | Yamaguchi | H01L 21/02021 |
| 9,517,544 | B2* | 12/2016 | Takahashi | B24B 9/065 |
| 9,561,573 | B2* | 2/2017 | Seki | B24B 21/004 |
| 9,586,303 | B2* | 3/2017 | Kato | B24B 21/18 |
| 9,595,302 | B2* | 3/2017 | Schudel | B21D 28/06 |

(56) References Cited

U.S. PATENT DOCUMENTS

| | | | | |
|---|---|---|---|---|
| 9,604,335 B2* | 3/2017 | Togawa | | B24B 21/008 |
| 9,630,289 B2* | 4/2017 | Togawa | | B24B 9/065 |
| 9,649,739 B2* | 5/2017 | Maeda | | B24B 21/004 |
| 9,666,440 B2* | 5/2017 | Nakanishi | | H01L 21/02057 |
| 9,694,467 B2* | 7/2017 | Seki | | B24B 9/065 |
| 9,718,164 B2* | 8/2017 | Lin | | H01L 21/02021 |
| 9,740,133 B2* | 8/2017 | Yamauchi | | G03G 15/0233 |
| 9,782,869 B2* | 10/2017 | Togawa | | B24B 37/005 |
| 9,808,903 B2* | 11/2017 | Ishii | | B24B 21/004 |
| 9,855,637 B2* | 1/2018 | Whipple | | B24B 49/14 |
| 9,855,736 B2* | 1/2018 | Shigeta | | B41C 1/00 |
| 9,857,680 B2* | 1/2018 | Pan | | G03F 1/82 |
| 9,914,196 B2* | 3/2018 | Seki | | B24B 21/002 |
| 9,931,726 B2* | 4/2018 | Chang | | B24B 9/065 |
| 9,993,840 B2* | 6/2018 | Inagaki | | B05D 1/02 |
| 10,032,642 B2* | 7/2018 | Sato | | H01L 21/67253 |
| 10,074,472 B2* | 9/2018 | Wang | | H01F 27/2804 |
| 10,074,542 B2* | 9/2018 | Kubo | | H01L 21/3043 |
| 10,105,792 B2* | 10/2018 | Hirata | | B23K 26/53 |
| 10,134,614 B2* | 11/2018 | Tada | | B24B 9/065 |
| 10,137,552 B2* | 11/2018 | Maeda | | B24B 21/004 |
| 10,144,103 B2* | 12/2018 | Seki | | B24B 21/002 |
| 10,155,294 B2* | 12/2018 | Seki | | B24B 21/002 |
| 10,166,647 B2* | 1/2019 | Takahashi | | B24B 9/065 |
| 10,245,696 B2* | 4/2019 | Doettling | | B23Q 1/66 |
| 10,249,518 B2* | 4/2019 | Adachi | | B24B 21/002 |
| 10,307,884 B2* | 6/2019 | Lehner | | H01L 21/463 |
| 10,328,465 B2* | 6/2019 | Ishii | | H01L 21/67046 |
| 10,343,252 B2* | 7/2019 | Togawa | | B24B 21/002 |
| 10,357,867 B2* | 7/2019 | Lin | | H01L 21/67703 |
| 10,368,467 B2* | 7/2019 | Gold | | G11B 15/00 |
| 10,391,608 B2* | 8/2019 | Chen | | B24B 37/30 |
| 10,414,013 B2* | 9/2019 | Seki | | B24B 21/002 |
| 10,427,269 B2* | 10/2019 | Kashiwagi | | B24B 9/065 |
| 2001/0002593 A1* | 6/2001 | Fishkin | | H01L 21/67046 |
| | | | | 134/1.3 |
| 2001/0014233 A1* | 8/2001 | Tomita | | G03G 15/0928 |
| | | | | 399/286 |
| 2002/0150831 A1* | 10/2002 | Ehara | | G03G 5/08214 |
| | | | | 430/123.41 |
| 2003/0138717 A1* | 7/2003 | Yagi | | G03G 9/0819 |
| | | | | 430/110.4 |
| 2004/0185365 A1* | 9/2004 | Saito | | G03G 9/0804 |
| | | | | 430/109.4 |
| 2006/0172214 A1* | 8/2006 | Saito | | G03G 9/0804 |
| | | | | 430/108.11 |
| 2007/0238393 A1* | 10/2007 | Shin | | B24B 9/065 |
| | | | | 451/5 |
| 2008/0193178 A1* | 8/2008 | Sugimoto | | G03G 21/0035 |
| | | | | 399/354 |
| 2008/0207093 A1* | 8/2008 | Ko | | B24B 9/065 |
| | | | | 451/44 |
| 2008/0291448 A1* | 11/2008 | Chen | | G01B 11/002 |
| | | | | 356/400 |
| 2008/0293329 A1* | 11/2008 | Miller | | B24B 9/065 |
| | | | | 451/5 |
| 2008/0293334 A1* | 11/2008 | Kollata | | B24B 9/065 |
| | | | | 451/41 |
| 2008/0293337 A1* | 11/2008 | Zhang | | B24B 1/04 |
| | | | | 451/44 |
| 2008/0293340 A1* | 11/2008 | Kollata | | B24B 9/065 |
| | | | | 451/285 |
| 2008/0293341 A1* | 11/2008 | Kollata | | B24B 9/065 |
| | | | | 451/285 |
| 2009/0017731 A1* | 1/2009 | Ettinger | | B24B 9/065 |
| | | | | 451/44 |
| 2009/0036039 A1* | 2/2009 | Shin | | B24B 9/065 |
| | | | | 451/177 |
| 2009/0053639 A1* | 2/2009 | Shimmura | | G03G 9/0819 |
| | | | | 430/106.2 |
| 2009/0202951 A1* | 8/2009 | Yamamoto | | G03F 7/168 |
| | | | | 430/322 |
| 2009/0262353 A1* | 10/2009 | Benvegnu | | B24B 37/013 |
| | | | | 356/433 |
| 2010/0022166 A1* | 1/2010 | Kimba | | B24B 9/065 |
| | | | | 451/5 |
| 2011/0141461 A1* | 6/2011 | Matsui | | G01N 21/9501 |
| | | | | 356/237.2 |
| 2011/0150525 A1* | 6/2011 | Fujiwara | | G03G 15/0822 |
| | | | | 399/111 |
| 2013/0213437 A1* | 8/2013 | Ishii | | H01L 21/68728 |
| | | | | 134/6 |
| 2013/0237033 A1* | 9/2013 | Nakanishi | | B24B 9/065 |
| | | | | 438/459 |
| 2014/0073069 A1* | 3/2014 | Takami | | H01L 21/6708 |
| | | | | 438/14 |
| 2014/0242885 A1* | 8/2014 | Nakao | | B24B 37/345 |
| | | | | 451/57 |
| 2014/0352736 A1* | 12/2014 | Yamamoto | | G03F 7/168 |
| | | | | 134/26 |
| 2015/0086923 A1* | 3/2015 | Kaneyama | | G03F 7/168 |
| | | | | 430/270.1 |
| 2015/0302897 A1* | 10/2015 | Schudel | | B21D 28/06 |
| | | | | 360/99.18 |
| 2016/0041490 A1* | 2/2016 | Suzumura | | G03G 15/0233 |
| | | | | 428/411.1 |
| 2016/0154336 A1* | 6/2016 | Masu | | G03G 15/0233 |
| | | | | 399/176 |
| 2016/0299451 A1* | 10/2016 | Kodama | | G03G 15/0233 |
| 2016/0358768 A1* | 12/2016 | Kodera | | H01L 21/02057 |
| 2017/0090329 A1* | 3/2017 | Yamauchi | | G03G 15/0233 |
| 2017/0136572 A1* | 5/2017 | Hirata | | B23K 26/53 |

* cited by examiner

SUBSTRATE PROCESSING METHOD AND APPARATUS

CROSS REFERENCE TO RELATED APPLICATION

This document claims priority to Japanese Patent Application Number 2017-60432 filed Mar. 27, 2017, the entire contents of which are hereby incorporated by reference.

BACKGROUND

From a viewpoint of improving yield in fabrication of semiconductor devices, management of surface conditions of a substrate has been attracting attention in recent years. In the fabrication process of the semiconductor devices, various materials are deposited on a silicon wafer. As a result, unwanted films and roughened surface are formed on a peripheral portion of the substrate. It has been a recent trend to transport the substrate by holding only its peripheral portion using arms. Under such circumstances, the unwanted films remaining on the peripheral portion would be peeled off during various processes and could adhere to devices, causing lowered yield. Thus, in order to remove the unwanted films formed on the peripheral portion of the substrate, the peripheral portion of the substrate is polished using a polishing apparatus.

As such polishing apparatus, there has been known an apparatus having a bevel polishing module for polishing a peripheral portion of a substrate using a polishing tape (for example, see Japanese Laid-open Patent Publication No. 2012-213849). This polishing apparatus includes a substrate holder for holding a substrate and rotating the substrate, a tape supply and recovery mechanism having a plurality of guide rollers for supporting the polishing tape, and a polishing head having a pressing member for pressing the polishing tape supplied from the tape supply and recovery mechanism against the peripheral portion of the substrate. The tape supply and recovery mechanism further includes a supply reel and a recovery reel, and the polishing tape supported by the plural guide rollers is fed from the supply reel to the recovery reel via the polishing head by a tape feed mechanism. The polishing tape which is fed at a predetermined feed speed from the supply reel to the recovery reel via the polishing head by the tape feed mechanism is pressed against the peripheral portion of the rotating substrate by the pressing member of the polishing head, thereby polishing the peripheral portion of the substrate.

Particles such as polishing debris are attached onto the substrate which has been polished by the bevel polishing module. Conventionally, such substrate is transferred from the bevel polishing module to a cleaning unit, and these particles are cleaned and rinsed away in the cleaning unit.

Further, conventionally, the presence or absence of dust in the vicinity of the central part of the substrate is measured by a particle counter or the like provided outside of the polishing apparatus and it is judged whether the substrate is clean or not, because it is not realistic to provide an expensive inspection apparatus in the bevel polishing apparatus in view of a cost advantage.

On the other hand, recently, as design rules of elements are miniaturized, for example, the detection size of the particle is required to be 45 nm or smaller in the particle counter, and thus technology development toward further improvement of detection sensitivity has been advanced. However, it has been found that an increase of the detection sensitivity causes a new problem of detecting LPD (Light Point Defect) of the surface which is unnecessary to be detected intrinsically (for example, see Japanese Laid-open Patent Publication No. 2013-4825). Therefore, if the particle counter is used in the substrate polishing apparatus regardless of growing requirement of the miniaturization, it is necessary to use the particle counter having precision which cannot fully check the presence or absence of dirt on the peripheral portion of the substrate due to the above limitation. Further, if a special and expensive inspection apparatus is not used, the central portion of the substrate cannot be observed. Thus, even in the substrate which has been judged to be clean using the particle counter which has been used heretofore, it is likely that foreign matter such as PID (Process Induced Defect) or adhered particles on the peripheral portion of the substrate is forced to move onto the device surface of the substrate due to some sort of trigger. Then, in such a case, it is likely that the device surface is adversely affected, but a countermeasure against such adverse effect has not been taken at all.

Therefore, there has been a demand for a technology of cleaning a peripheral portion of a substrate after polishing the peripheral portion of the substrate and then checking the cleaning effect of the peripheral portion of the substrate immediately, and cleaning the peripheral portion of the substrate again as needed.

Further, if the dirt of the substrate is found after completing all the processing, and immediately before returning the substrate to the FOUP or after carrying the substrate out of the apparatus, it is necessary to clean the substrate again, thus causing loss of time and extra work due to the follow-up cleaning.

Further, if an area of the substrate which could not have been cleaned heretofore without using contact cleaning which may cause a defect of the peripheral portion of the substrate can be cleaned, the adverse effect on the device surface can be prevented.

SUMMARY OF THE INVENTION

According to an embodiment, there is provided a substrate processing method and apparatus which can clean a peripheral portion of a substrate after polishing the peripheral portion of the substrate and can check the cleaning effect of the peripheral portion of the substrate, and can reliably clean the peripheral portion of the substrate as an area which could not have been cleaned heretofore.

Embodiments, which will be described below, relate to a substrate processing method and apparatus for polishing a peripheral portion of a substrate such as a semiconductor wafer and cleaning the peripheral portion of the substrate which has been polished.

In an embodiment, there is provided a substrate processing method comprising: holding a substrate and rotating the substrate by a substrate holder; polishing a peripheral portion of the substrate by pressing a polishing tape having abrasive grains against the peripheral portion of the substrate with a first head; cleaning the peripheral portion of the substrate by supplying a cleaning liquid from a cleaning nozzle to the peripheral portion of the substrate which has been polished; bringing a tape having no abrasive grains into contact with the peripheral portion of the substrate which has been cleaned, by a second head; applying light to the tape which has been brought into contact with the peripheral portion of the substrate and receiving reflected light from the tape by a sensor; and judging that the peripheral portion of the substrate is contaminated when an intensity of the received reflected light is lower than a predetermined value.

In an embodiment, the tape having no abrasive grains comprises a base tape and a non-woven fabric or a porous layer held on the base tape, and the non-woven fabric or the porous layer is brought into contact with the peripheral portion of the substrate.

In an embodiment, the cleaning nozzle comprises a two-fluid jet nozzle, and a mixed fluid of a liquid and a gas is supplied to the peripheral portion of the substrate to clean the peripheral portion of the substrate by the two-fluid jet nozzle.

In an embodiment, ozone water or the cleaning liquid to which megasonic is imparted is supplied to the peripheral portion of the substrate to clean the peripheral portion of the substrate by the cleaning nozzle.

In an embodiment, when the peripheral portion of the substrate is judged to be contaminated, the peripheral portion of the substrate is cleaned again.

In an embodiment, there is provided a substrate processing apparatus comprising: a substrate holder configured to hold a substrate and to rotate the substrate; a first head configured to polish a peripheral portion of the substrate by pressing a polishing tape having abrasive grains against the peripheral portion of the substrate; a cleaning nozzle configured to clean the peripheral portion of the substrate by supplying a cleaning liquid to the peripheral portion of the substrate which has been polished; a second head configured to bring a tape having no abrasive grains into contact with the peripheral portion of the substrate which has been cleaned; a sensor configured to apply light to the tape which has been brought into contact with the peripheral portion of the substrate and to receive reflected light from the tape; and a controller configured to control such that: the first head polishes the peripheral portion of the substrate; the cleaning nozzle cleans the peripheral portion of the substrate which has been polished; the second head brings the tape having no abrasive grains into contact with the peripheral portion of the substrate which has been cleaned; and the controller configured to compare an intensity of the received reflected light with a predetermined value and to judge that the peripheral portion of the substrate is contaminated when the intensity of the reflected light is lower than the predetermined value.

In an embodiment, the cleaning nozzle comprises a two-fluid jet nozzle, and a mixed fluid of a liquid and a gas is supplied to the peripheral portion of the substrate to clean the peripheral portion of the substrate by the two-fluid jet nozzle.

In an embodiment, ozone water or the cleaning liquid to which megasonic is imparted is supplied to the peripheral portion of the substrate to clean the peripheral portion of the substrate by the cleaning nozzle.

In an embodiment, when the peripheral portion of the substrate is judged to be contaminated by the controller, the peripheral portion of the substrate is cleaned again by the cleaning nozzle.

In an embodiment, the second head comprises the tape having no abrasive grains, a pressing member arranged at a rear surface side of the tape having no abrasive grains, and a pressing mechanism configured to press the pressing member against the peripheral portion of the substrate through the tape having no abrasive grains, wherein the tape having no abrasive grains comprises a base tape and a non-woven fabric or a porous layer held on the base tape, and the non-woven fabric or the porous layer is brought into contact with the peripheral portion of the substrate.

In an embodiment, the second head comprises a tilting mechanism configured to tilt the pressing member and the pressing mechanism integrally to bring the tape having no abrasive grains into contact with a top edge portion, a bottom edge portion, and a bevel portion of the substrate, respectively.

In an embodiment, the controller transmits a signal for cleaning the peripheral portion of the substrate again to the cleaning nozzle when judging the peripheral portion of the substrate to be contaminated.

In an embodiment, there is provided a substrate processing system comprising: the above-described substrate processing apparatus; a storage unit configured to store data of a processing recipe for processing the substrate by the substrate processing apparatus; a mode setting unit configured to determine an auto mode for setting a processing recipe by retrieving data of the processing recipe from the storage unit with an input of data of the kind of the substrate by an operator or a manual mode for setting a processing recipe by specifying processing conditions with hand by the operator; and an operation control unit configured to control the operation of the substrate processing apparatus based on the set processing recipe.

In an embodiment, there is provided a substrate processing apparatus comprising: a substrate holding stage configured to hold a substrate and to rotate the substrate; a first head configured to polish a peripheral portion of the substrate by pressing a polishing tape having abrasive grains against the peripheral portion of the substrate held by the substrate holding stage; and a two-fluid jet nozzle configured to clean the peripheral portion of the substrate by supplying a jet flow of a mixed fluid of a liquid and a gas to the peripheral portion of the substrate held by the substrate holding stage.

In an embodiment, the substrate processing apparatus further comprises a tilting mechanism configured to allow the two-fluid jet nozzle to be tiltable with respect to the peripheral portion of the substrate.

In an embodiment, the tilting mechanism is configured to be tiltable in the range of $-90°$ to $+90°$ around the peripheral portion of the substrate.

In an embodiment, the plural two-fluid jet nozzles are provided.

In an embodiment, there is provided a substrate processing method comprising: holding a substrate on a substrate holding stage and rotating the substrate; polishing a peripheral portion of the substrate by pressing a polishing tool having abrasive grains against the peripheral portion of the substrate which is rotated; and cleaning the peripheral portion of the substrate by supplying a jet flow of a mixed fluid of a liquid and a gas to the peripheral portion of the substrate held by the substrate holding stage.

In an embodiment, the polishing tool having abrasive grains comprises a polishing tape attached to a first head, and the first head polishes a top edge portion of the substrate; and said cleaning comprises supplying the jet flow of the mixed fluid of the liquid and the gas sequentially to the peripheral portion of the substrate so that the top edge portion of the substrate is initially cleaned and then a bevel portion and/or a bottom edge portion of the substrate is cleaned.

In an embodiment, the polishing tool having abrasive grains comprises a polishing tape attached to a first head, and the first head polishes a bottom edge portion of the substrate; and said cleaning comprises supplying the jet flow of the mixed fluid of the liquid and the gas sequentially to the peripheral portion of the substrate so that the bottom edge portion of the substrate is initially cleaned and then a bevel portion and/or a top edge portion of the substrate is cleaned.

In an embodiment, the polishing tool having abrasive grains comprises a polishing tape attached to a first head, and the first head polishes a bevel portion of the substrate; and said cleaning comprises supplying the jet flow of the mixed fluid of the liquid and the gas sequentially to the peripheral portion of the substrate so that the bevel portion of the substrate is initially cleaned and then a top edge portion and/or a bottom edge portion of the substrate is cleaned.

In an embodiment, there is provided a substrate processing apparatus comprising: a substrate holding stage configured to hold a substrate and to rotate the substrate; a first head configured to polish a peripheral portion of the substrate by pressing a polishing tool against the peripheral portion of the substrate held by the substrate holding stage; a two-fluid jet nozzle configured to clean the peripheral portion of the substrate by supplying a jet flow of a mixed fluid of a liquid and a gas to the peripheral portion of the substrate held by the substrate holding stage; and a tilting mechanism configured to allow the two-fluid jet nozzle to be tiltable in the range of −90° to +90° around the peripheral portion of the substrate.

The above-described embodiments offer the following advantages:

1) A peripheral portion of a substrate can be cleaned after polishing the peripheral portion of the substrate and then the cleaning effect of the peripheral portion of the substrate can be checked immediately, and further the peripheral portion of the substrate can be cleaned again as needed.

2) Because after confirming that the peripheral portion of the substrate is cleaned cleanly, the substrate can be brought into the subsequent process, loss of time and extra work caused by the follow-up cleaning after the remaining dirt on the substrate is found can be suppressed.

3) Because the peripheral portion of the substrate as an area which could not have been cleaned heretofore can be cleaned without using contact cleaning which may cause a defect of the peripheral portion of the substrate, a substrate cleaning apparatus and method which can suppress the adverse effect on the device surface can be provided.

BRIEF DESCRIPTION OF THE DRAWINGS

FIG. 1A is a cross-sectional view of a so-called straight-type wafer, and FIG. 1B is a cross-sectional view of a so-called round-type wafer;

DESCRIPTION OF EMBODIMENTS

Figure 1A:
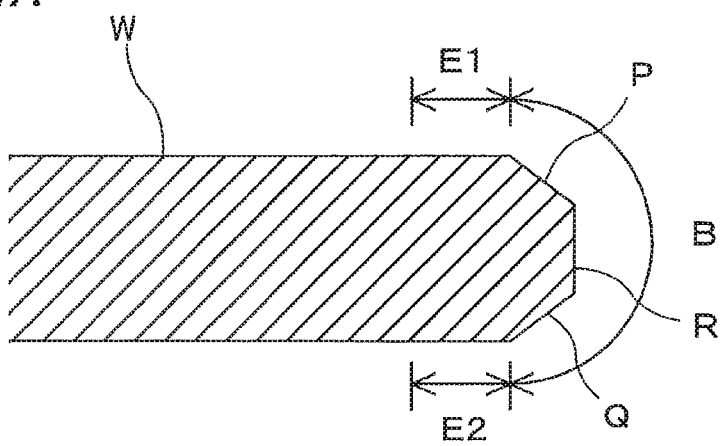
FIG. 1A and FIG. 1B are enlarged cross-sectional views each showing a peripheral portion of a wafer as an example of a substrate.

Embodiments of a substrate processing method and apparatus according to the embodiments will be described below with reference to FIGS. 1 through 16. In FIGS. 1 through 16, identical or corresponding parts are denoted by identical or corresponding reference numerals throughout views, and will not be described in duplication.

Figure 1B:
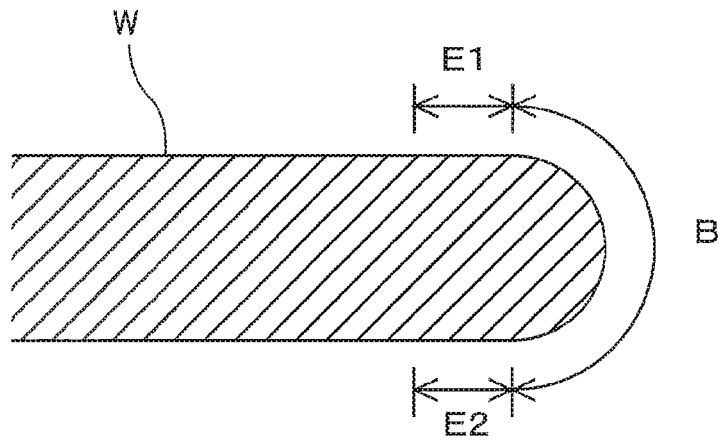

FIG. 1A and FIG. 1B are enlarged cross-sectional views each showing a peripheral portion of a wafer as an example of a substrate. More specifically, FIG. 1A is a cross-sectional view of a so-called straight-type wafer, and FIG. 1B is a cross-sectional view of a so-called round-type wafer. In the wafer W shown in FIG. 1A, the bevel portion is an outermost circumferential surface of the wafer W (indicated by a letter B) that is constituted by an upper slope portion (an upper bevel portion) P, a lower slope portion (a lower bevel portion) Q, and a side portion (an apex) R. In the wafer W shown in FIG. 1B, the bevel portion is a portion (indicated by a letter B) having a curved cross section and forming an outermost circumferential surface of the wafer W. A top edge portion is a flat portion E1 located radially inwardly of the bevel portion B. A bottom edge portion is a flat portion E2 located on the opposite side of the top edge portion and located radially inwardly of the bevel portion B. The top edge portion may also include a region where the devices are formed. These top edge portion E1 and bottom edge portion E2 may be collectively referred to as near-edge portions.

Figure 2:
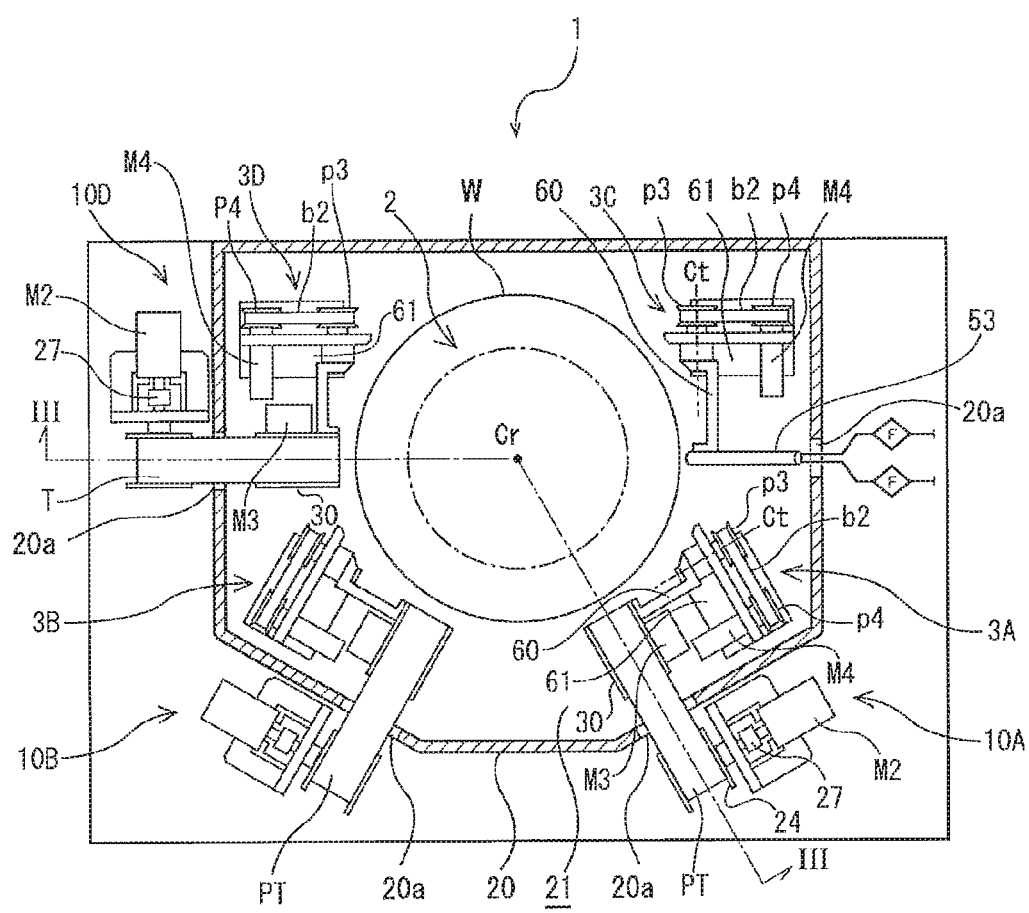
FIG. 2 is a plan view showing a substrate processing apparatus according to the embodiments.
Figure 3:
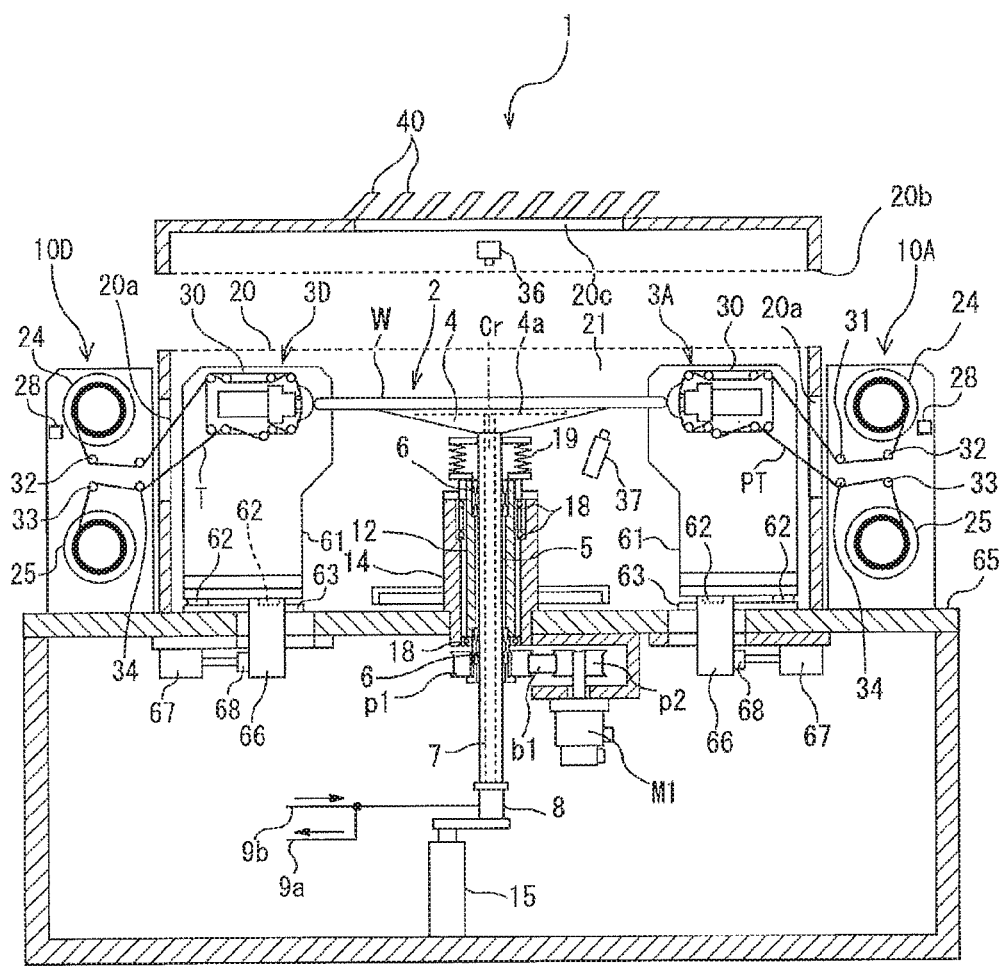
FIG. 3 is a cross-sectional view taken along line III-III in FIG. 2.

FIG. 2 is a plan view showing a substrate processing apparatus according to the embodiments. FIG. 3 is a cross-sectional view taken along line III-III in FIG. 2. As shown in FIG. 2, the substrate processing apparatus 1 includes a substrate holder 2 configured to hold a wafer (substrate) W as an object to be polished horizontally and to rotate the wafer W, two first heads 3A, 3B configured to polish the peripheral portion of the wafer W by pressing a polishing tape PT having abrasive grains against the peripheral portion of the wafer W, a cleaning head 3C having a cleaning nozzle configured to clean the peripheral portion of the wafer W by supplying a cleaning liquid to the peripheral portion of the wafer W after polishing, and a second head 3D configured to bring a tape T having no abrasive grains into contact with the peripheral portion of the wafer W after cleaning. FIGS. 2 and 3 show the state in which the substrate holder 2 holds the wafer W. This substrate holder 2 has a dish-shaped holding stage 4 configured to hold a rear surface of the wafer W by a vacuum suction, a hollow shaft 5 coupled to a central portion of the holding stage 4, and a motor M1 for rotating the hollow shaft 5. The wafer W is placed onto the holding stage 4 by a transporting unit (not shown) such that a center of the wafer W is aligned with a central axis of the hollow shaft 5.

The hollow shaft 5 is supported by ball spline bearings (i.e., linear motion bearings) 6 which allow the hollow shaft 5 to move vertically. The holding stage 4 has an upper surface having grooves 4a. These grooves 4a communicate with a communication passage 7 extending through the hollow shaft 5. The communication passage 7 is coupled to a vacuum line 9a via a rotary joint 8 provided on a lower end of the hollow shaft 5. The communication passage 7 is also coupled to a nitrogen-gas supply line 9b for removing the wafer W after processing from the holding stage 4. By selectively coupling the vacuum line 9a and the nitrogen-gas supply line 9b to the communication passage 7, the wafer W can be held on the upper surface of the holding stage 4 by the vacuum suction and can be released from the upper surface of the holding stage 4.

A pulley p1 is coupled to the hollow shaft 5, and a pulley p2 is mounted on a rotational shaft of the motor M1. The hollow shaft 5 is rotated by the motor M1 through the pulley p1, the pulley p2, and a belt b1 riding on these pulleys p1 and p2. The ball spline bearing 6 is a bearing that allows the hollow shaft 5 to move freely in its longitudinal direction. The ball spline bearings 6 are secured to a cylindrical casing 12. Therefore, in the resent embodiment, the hollow shaft 5 can move linearly up and down relative to the casing 12, and the hollow shaft 5 and the casing 12 rotate in unison. The hollow shaft 5 is coupled to an air cylinder (elevating mechanism) 15, so that the hollow shaft 5 and the holding stage 4 are elevated and lowered by the air cylinder 15.

A cylindrical casing 14 is provided so as to surround the casing 12 in a coaxial arrangement. Radial bearings 18 are provided between the casing 12 and the cylindrical casing 14, so that the casing 12 is rotatably supported by the radial bearings 18. With these structures, the substrate holder 2 can rotate the wafer W about its central axis Cr and can elevate and lower the wafer W along the central axis Cr.

As shown in FIG. 2, the two first heads 3A, 3B for polishing the peripheral portion of the wafer W by the polishing tape PT, the cleaning head 3C for cleaning the peripheral portion of the wafer W, and the second head 3D for bringing the tape T having no abrasive grains into contact with the peripheral portion of the wafer W after cleaning are disposed radially outwardly of the wafer W so as to surround the wafer W held by the substrate holder 2.

In this embodiment, tape supply and recovery mechanisms 10A, 10B, and 10D are provided radially outwardly of the two first heads 3A, 3B and the second head 3D, respectively. The two first heads 3A, 3B and the second head 3D are isolated from the tape supply and recovery mechanisms 10A, 10B, and 10D by a partition 20. An interior space of the partition 20 provides a processing room 21. The four heads 3A, 3B, 3C, and 3D and the holding stage 4 are located in the processing room 21. On the other hand, the tape supply and recovery mechanisms 10A, 10B, and 10D are located outside the partition 20 (i.e., outside the processing room 21). The two first heads 3A and 3B have the same structure, and the tape supply and recovery mechanisms 10A and 10B also have the same structure.

Next, the first head 3A for polishing the peripheral portion of the wafer W by pressing the polishing tape PT having abrasive grains against the peripheral portion of the wafer W, and the tape supply and recovery mechanism 10A for supplying the polishing tape PT and recovering the polishing tape PT will be described with reference to FIGS. 2 and 3.

The tape supply and recovery mechanism 10A has a supply reel 24 for supplying a polishing tape PT having abrasive grains to the first head 3A, and a recovery reel 25 for recovering the polishing tape PT that has been used for polishing the wafer W. The supply reel 24 is arranged above the recovery reel 25. Motors M2 are coupled to the supply reel 24 and the recovery reel 25, respectively, via couplings 27 (FIG. 2 shows only the coupling 27 and the motor M2 coupled to the supply reel 24). Each of the motors M2 is configured to exert a constant torque in a predetermined rotational direction so as to apply a predetermined tension to the polishing tape PT.

The polishing tape PT is a long strip-shaped polishing tool, and one of surfaces of the polishing tape PT provides a polishing surface. The polishing tape PT includes a base tape made from PET sheet or the like and a polishing layer formed on the base tape as an example. The polishing layer comprises a binder (e.g., resin) covering one surface of the base tape, and abrasive grains bound by the binder. The surface of the polishing layer serves as the polishing surface.

The polishing tape PT is mounted on the tape supply and recovery mechanism 10A in a state where the polishing tape PT is wound on the supply reel 24. Side surfaces of the wound polishing tape PT are supported by reel plates so that the wound polishing tape PT does not collapse. One end of the polishing tape PT is attached to the recovery reel 25. The recovery reel 25 takes up the polishing tape PT that has been supplied to the first head 3A to thereby recover the polishing tape PT. Further, an end mark (not shown) is put on the polishing tape PT set on the supply reel 24 at a position near the rear end of the polishing tape PT, and a mark detection sensor 28 capable of detecting the end mark is provided in the vicinity of the supply reel 24.

The first head 3A has a head body 30 for pressing the polishing tape PT, supplied from the tape supply and recovery mechanism 10A, against a peripheral portion of the wafer W. The polishing tape PT is supplied to the head body 30 such that the polishing surface of the polishing tape PT faces the wafer W.

The tape supply and recovery mechanism 10A has plural guide rollers 31, 32, 33, and 34. The polishing tape PT, to be supplied to and recovered from the first head 3A, is guided by these guide rollers 31, 32, 33, and 34. The polishing tape PT is supplied to the head body 30 from the supply reel 24 through an opening 20a formed in the partition 20, and the polishing tape PT that has been used is recovered by the recovery reel 25 through the opening 20a.

As shown in FIG. 3, an upper supply nozzle 36 is provided above the wafer W. This upper supply nozzle 36 is configured to supply a polishing liquid onto a center of an upper surface of the wafer W held by the substrate holder 2. Further, a lower supply nozzle 37 is provided for supplying a polishing liquid onto a boundary between the rear surface of the wafer W and the holding stage 4 of the substrate holder 2 (i.e., onto a peripheral portion of the holding stage 4). Typically, pure water is used as the polishing liquid. The substrate processing apparatus 1 further includes a head cleaning nozzle (not shown) for cleaning the head body 30 after the polishing process of the wafer W. The wafer W is elevated by the substrate holder 2 after the polishing process, and then the head cleaning nozzle ejects cleaning water toward the head body 30, whereby the head body 30 is cleaned after the polishing process.

In order to isolate mechanical devices, such as the ball spline bearings 6 and the radial bearings 18, from the processing room 21 when the hollow shaft 5 is elevated and lowered relative to the casing 12, the hollow shaft 5 and an upper end of the casing 12 are coupled to each other by a bellows 19 that is extensible and contractible in a vertical direction, as shown in FIG. 3. FIG. 3 shows a state in which the hollow shaft 5 is in a lowered position and the holding stage 4 is in a processing position. After the processing, the air cylinder 15 elevates the wafer W, together with the holding stage 4 and the hollow shaft 5, to a transport position where the wafer W is released from the holding stage 4.

The partition 20 has an entrance 20b through which the wafer W is transported into and removed from the processing room 21. The entrance 20b is formed as a horizontally extending cutout. Therefore, the wafer W, held by the transporting mechanism (not shown in the drawing), can travel across the processing room 21 through the entrance 20b while the wafer is kept in a horizontal state. An upper surface of the partition 20 has an aperture 20c and louvers 40, and a lower surface of the partition 20 has a gas-discharge opening (not shown in the drawing). During the processing, the entrance 20b is closed by a non-illustrated shutter. Therefore, as a fan mechanism (not shown in the drawing) is driven to evacuate an air through the gas-discharge opening, downward flow of clean air is formed in the processing room 21. Because the substrate processing is performed under such conditions, the polishing liquid and the cleaning liquid are prevented from scattering upwardly. Therefore, various processing can be performed while an upper space of the processing room 21 is kept clean.

As shown in FIG. 2, the head body 30 for pressing the polishing tape PT against the peripheral portion of the wafer W is secured to one end of an arm 60, which is rotatable about a rotational axis Ct extending parallel to a tangential direction of the wafer W. The other end of the arm 60 is coupled to a motor M4 via pulleys p3 and p4 and a belt b2. As the motor M4 rotates in a clockwise direction and a counterclockwise direction through a certain angle, the arm 60 rotates about the axis Ct through a certain angle. In this embodiment, the motor M4, the arm 60, the pulleys p3 and p4, and the belt b2 constitute a tilting mechanism for tilting the head body 30.

The tilting mechanism is mounted on a movable base 61. As shown in FIG. 3, this movable base 61 is movably coupled to a base plate 65 via guides 62 and rails 63. The rails 63 extend linearly in a radial direction of the wafer W held on the substrate holder 2, so that the movable base 61 can move linearly in the radial direction of the wafer W. A connection plate 66, extending through the base plate 65, is secured to the movable base 61. A linear actuator 67 is coupled to the connection plate 66 via a joint 68. This linear actuator 67 is secured to the base plate 65 directly or indirectly.

The linear actuator 67 may comprise an air cylinder or a combination of a positioning motor and a ball screw. The linear actuator 67, the rails 63, and the guides 62 constitute a moving mechanism for linearly moving the head body 30 in the radial direction of the wafer W. Specifically, the moving mechanism is operable to move the head body 30 closer to and away from the wafer W along the rails 63. On the other hand, the tape supply and recovery mechanism 10A is fixed to the base plate 65.

Figure 4:
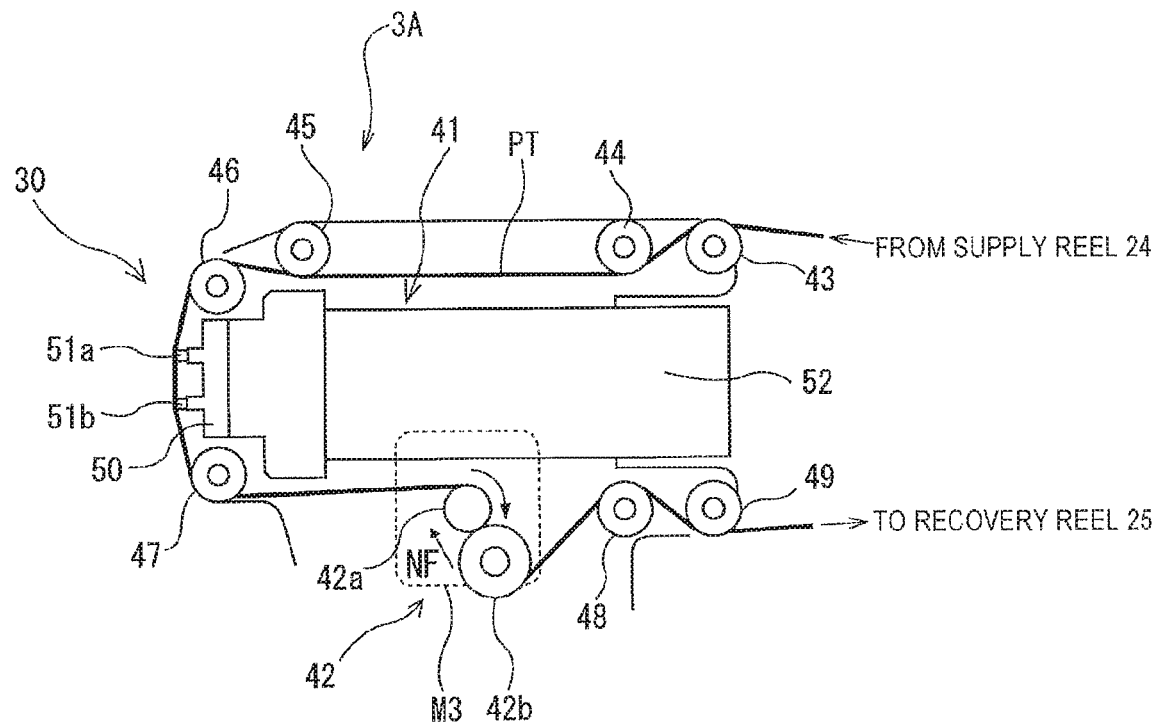
FIG. 4 is an enlarged view of a first head.

FIG. 4 is an enlarged view of the first head 3A. As shown in FIG. 4, the first head 3A has the head body 30 for pressing the polishing tape PT having abrasive grains against the peripheral portion of the wafer W. The head body 30 has a pressing mechanism 41 configured to press the polishing surface of the polishing tape PT against the wafer W at a predetermined force, and a tape feed mechanism 42 configured to feed the polishing tape PT from the supply reel 24 to the recovery reel 25. The tape feed mechanism 42 includes a tape feed roller 42a for feeding the polishing tape PT, a nip roller 42b for pressing the polishing tape PT against the tape feed roller 42a, and a tape feed motor M3 for rotating the tape feed roller 42a. The nip roller 42b is supported by a non-illustrated mechanism, which biases the nip roller 42b in a direction indicated by arrow NF in FIG. 4 (i.e., in a direction toward the tape feed roller 42a) so as to press the nip roller 42b against the tape feed roller 42a.

The polishing tape PT is sandwiched between the tape feed roller 42a and the nip roller 42b. As the tape feed roller 42a is rotated in a direction indicated by arrow in FIG. 4, the tape feed roller 42a is rotated to feed the polishing tape PT from the supply reel 24 to the recovery reel 25 via the head body 30. The nip roller 42b is configured to be rotatable freely about its own axis and is rotated as the polishing tape PT is fed. The head body 30 has plural guide rollers 43, 44, 45, 46, 47, 48, and 49, which guide the polishing tape PT such that the polishing tape PT travels in a direction perpendicular to the tangential direction of the wafer W.

The pressing mechanism 41 includes a pressing member 50 located at the rear side of the polishing tape PT, and an air cylinder (an actuator) 52 configured to move the pressing member 50 toward the peripheral portion of the wafer W. The pressing member 50 has two protrusions 51a and 51b formed on a front surface thereof. The force for pressing the polishing tape PT against the wafer W is adjusted by controlling a pressure of gas (e.g., air) supplied to the air cylinder 52. The respective heads 3A, 3B, and 3D arranged around the wafer W have the tilting mechanisms, the pressing mechanisms 41, and the tape feed mechanisms 42, which are capable of operating independently. Further, the moving mechanisms for moving the respective heads are capable of operating independently.

Figure 5:
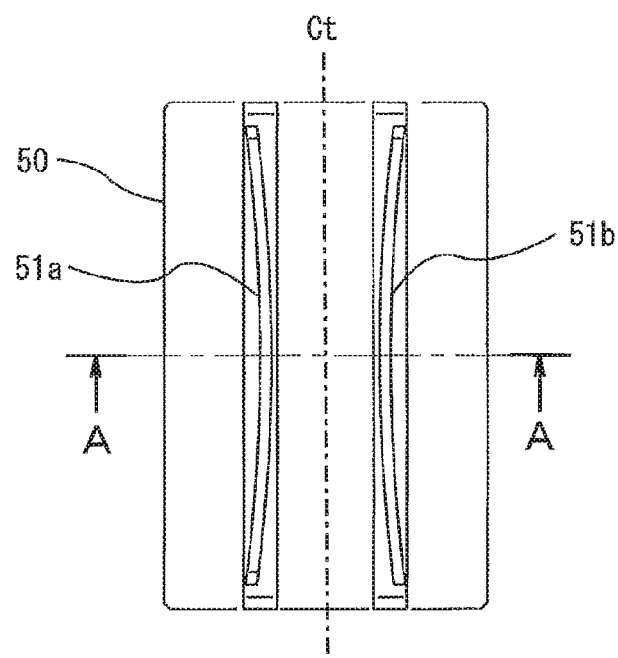
FIG. 5 is a front view of a pressing member shown in FIG. 4.
Figure 6:
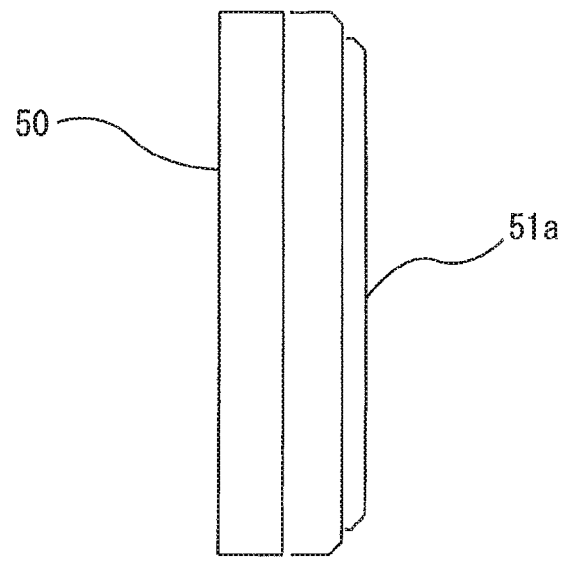
FIG. 6 is a side view of the pressing member shown in FIG. 5.
Figure 7:
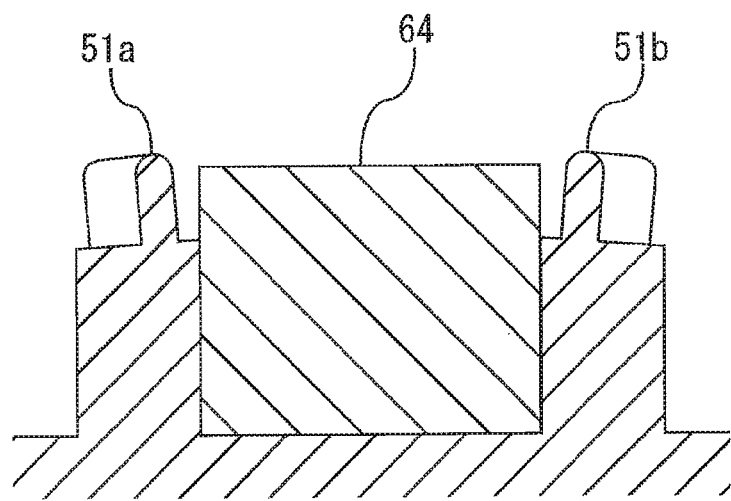
FIG. 7 is a cross-sectional view taken along line A-A in FIG. 5.

FIG. 5 is a front view of the pressing member 50 shown in FIG. 4, FIG. 6 is a side view of the pressing member 50 shown in FIG. 5, and FIG. 7 is a cross-sectional view taken along line A-A in FIG. 5. As shown in FIGS. 5 to 7, the pressing member 50 has two protrusions 51a and 51b formed on a front surface thereof. These protrusions 51a and 51b are in a shape of rail and are arranged in parallel. The protrusions 51a and 51b are curved along the circumferential direction of the wafer W. More specifically, the protrusions 51a and 51b have a circular arc shape whose curvature is substantially the same as a curvature of the wafer W.

The two protrusions 51a and 51b are symmetrical about the rotational axis Ct (see FIG. 2). As shown in FIG. 5, the protrusions 51a and 51b are curved inwardly toward the rotational axis Ct as viewed from a front of the pressing member 50. The head body 30 is disposed such that a center line (i.e., the rotational axis Ct) extending between tip ends of the protrusions 51a and 51b coincides with a center of a thickness of the wafer W. The protrusions 51a and 51b are arranged such that the protrusions 51a and 51b are closer to the wafer W than the guide rollers 46 and 47 (see FIG. 4) that are disposed at the front of the head body 30, so that the polishing tape PT is supported from the rear side thereof by the protrusions 51a and 51b. The protrusions 51a and 51b are made from resin, such as PEEK (polyetheretherketone).

As shown in FIG. 7, a pressing pad (or bevel pad) 64 is provided between the two protrusions 51a and 51b. This pressing pad 64 is made from closed-cell foam material (e.g., silicone rubber) having elasticity. A height of the pressing pad 64 is slightly lower than a height of the protrusions 51a and 51b. When the pressing member 50 is moved toward the wafer W by the air cylinder 52 in a state where the head body 30 is kept horizontally, the pressing pad 64 presses the polishing tape PT from the rear side thereof against the peripheral portion of the wafer W.

Figure 8:
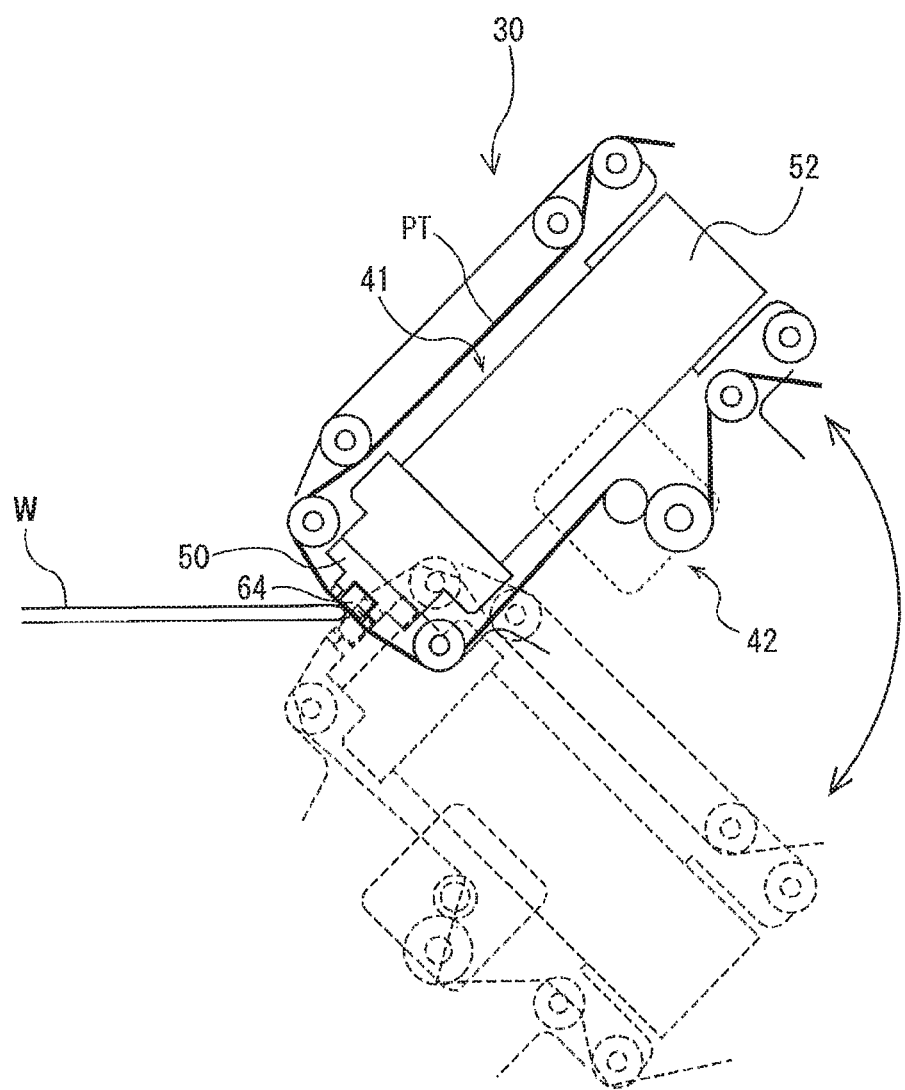
FIG. 8 is a view showing the state in which a head body polishes the peripheral portion of the wafer.
Figure 9:
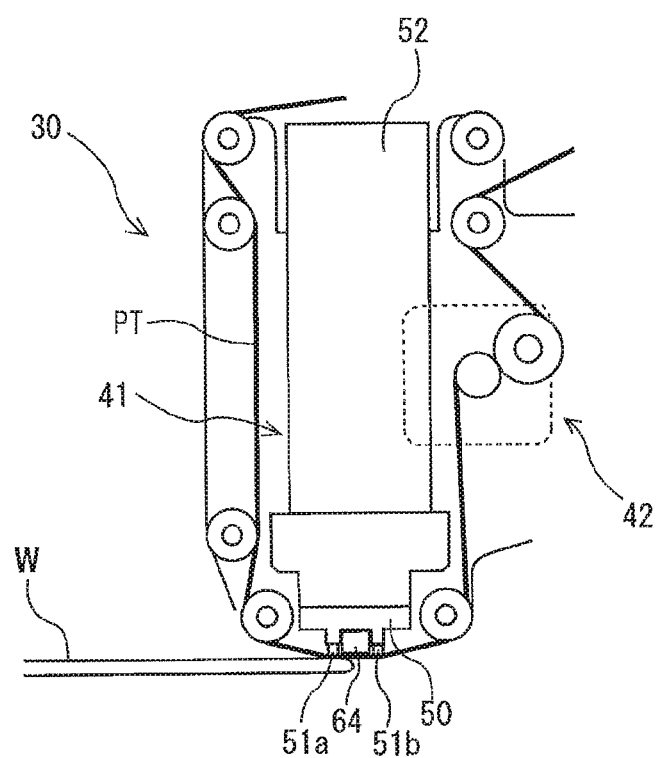
FIG. 9 is a view showing the state in which the head body polishes the peripheral portion of the wafer.
Figure 10:
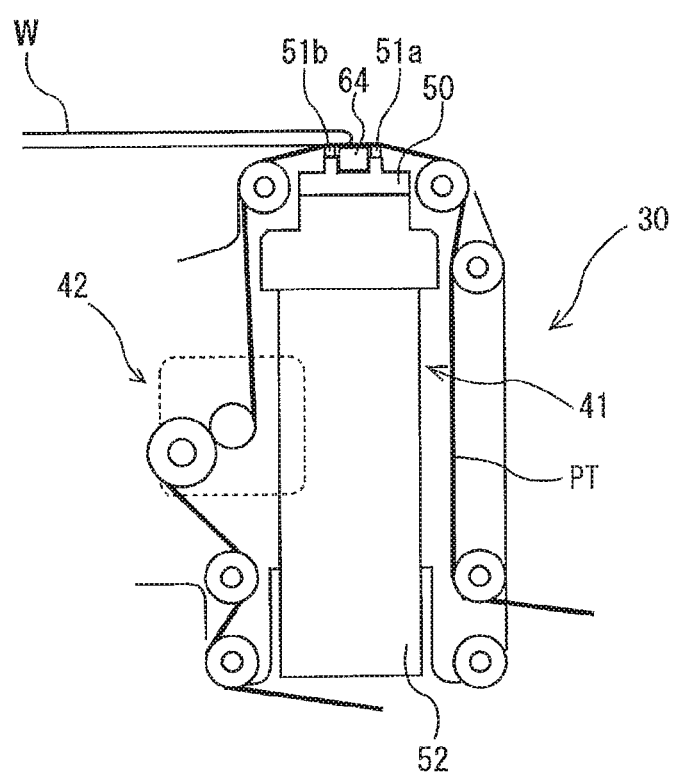
FIG. 10 is a view showing the state in which the head body polishes the peripheral portion of the wafer.

FIGS. 8 to 10 are views showing the state in which the head body 30 polishes the peripheral portion of the wafer W. When polishing the bevel portion of the wafer W, as shown in FIG. 8, the polishing tape PT is pressed against the bevel portion of the wafer W by the pressing pad 64 while the inclination angle of the head body 30 is changed continuously by the above-described tilting mechanism. During polishing, the polishing tape PT may be fed at a predetermined speed by the tape feed mechanisms 42. Further, the head body 30 is capable of polishing the top edge portion and the bottom edge portion of the wafer W. Specifically, as shown in FIG. 9, the head body 30 is inclined upward to allow the protrusion 51a to press the polishing tape PT against the top edge portion of the wafer W, thereby polishing the top edge portion of the wafer W. Further, as shown in FIG. 10, the head body 30 is inclined downward to allow the protrusion 51b to press the polishing tape PT against the bottom edge portion of the wafer W, thereby polishing the bottom edge portion of the wafer W.

The first heads 3A and 3B according to the present embodiment can polish the entire peripheral portion of the wafer W including the top edge portion, the bevel portion and the bottom edge portion. For example, in order to increase the polishing rate, the first head 3A may polish the entire peripheral portion of the wafer W including the top edge portion, the bevel portion, and the bottom edge portion. At the same time, the first head 3B may polish the entire peripheral portion of the wafer W including the top edge portion, the bevel portion, and the bottom edge portion. Alternatively, the first head 3A may polish the top edge portion, the first head 3B may polish the bevel portion, and the first head 3A or the first head 3B may polish the top edge portion.

Figure 11:
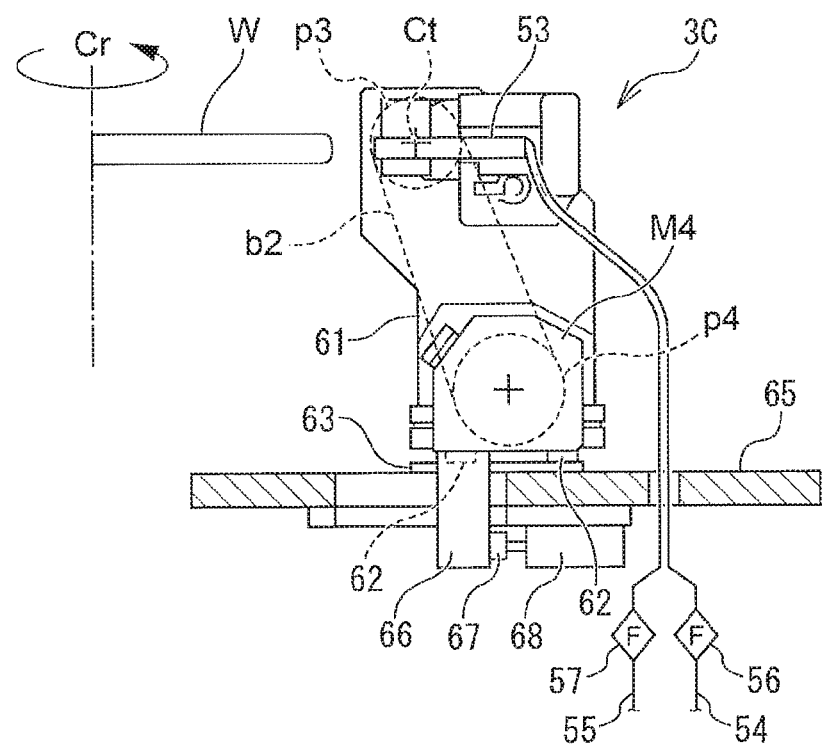
FIG. 11 is an elevational view of a cleaning head.

Next, the cleaning head 3C for cleaning the peripheral portion of the wafer W after polishing by supplying the cleaning liquid to the peripheral portion of the wafer W will be described with reference to FIGS. 2 and 11. FIG. 11 is an elevational view showing the cleaning head 3C. A plurality of cleaning heads 3C may be installed by additionally providing the cleaning head 3C between the first head 3A and the first head 3B and/or between the cleaning head 3C and the second head 3D.

As shown in FIGS. 2 and 11, the cleaning head 3C includes a cleaning nozzle 53 configured to clean the wafer W after polishing by supplying the cleaning liquid to the peripheral portion of the wafer W. The cleaning nozzle 53 is secured to one end of an arm 60, which is rotatable about a rotational axis Ct extending parallel to a tangential direction of the wafer W. The other end of the arm 60 is coupled to a motor M4 via pulleys p3 and p4 and a belt b2. As the motor M4 rotates in a clockwise direction and a counterclockwise direction through a certain angle, the arm 60 rotates about the axis Ct through a certain angle. In this embodiment, the motor M4, the arm 60, the pulleys p3 and p4, and the belt b2 constitute a tilting mechanism for tilting the cleaning nozzle 53. By this tilting mechanism, the cleaning nozzle 53 is capable of tilting in the range of −90° to +90° around the peripheral portion of the wafer W.

The tilting mechanism is mounted on a movable base 61. In the tilting mechanism mounted on the movable base 61, the pulleys are attached to a motor-side shaft and a tilting-side shaft, and the pulleys are coupled by the belt. When the cleaning nozzle 53 is tilted by the tilting mechanism, the cleaning nozzle 53 is capable of tilting in the range of −90° to +90° around the peripheral portion of the wafer W by positioning control of the motor. As shown in FIG. 11, the movable base 61 is movably coupled to a base plate 65 via guides 62 and rails 63. The rails 63 extend linearly in a radial direction of the wafer W held on the substrate holder 2, so that the movable base 61 can move linearly in the radial direction of the wafer W. A connection plate 66, extending through the base plate 65, is secured to the movable base 61. A linear actuator 67 is coupled to the connection plate 66 via a joint 68. This linear actuator 67 is secured to the base plate 65 directly or indirectly.

The linear actuator 67 may comprise an air cylinder or a combination of a positioning motor and a ball screw. The linear actuator 67, the rails 63, and the guides 62 constitute a moving mechanism for linearly moving the cleaning nozzle 53 in the radial direction of the wafer W. Specifically, the moving mechanism is operable to move the cleaning nozzle 53 closer to and away from the wafer W along the rails 63.

As shown in FIG. 11, the cleaning nozzle 53 comprises a two-fluid jet nozzle configured to clean the peripheral portion of the wafer W by supplying a jet flow of a mixed fluid of a liquid and a gas to the peripheral portion of the wafer W. A cleaning liquid supply line 54 for supplying a cleaning liquid such as pure water or water containing a dissolved $CO_2$ gas and a gas supply line 55 for supplying a gas such as an N2 gas or a dry air are connected to the rear end of the cleaning nozzle 53. In the respective lines 54, 55, regulators 56, 57 for regulating a flow rate of the cleaning liquid and a flow rate of the gas, respectively are provided. The respective lines 54, 55 comprise a stretchable and bendable bellows or the like.

According to the cleaning nozzle 53 shown in FIG. 11, the cleaning liquid such as pure water or water containing a dissolved $CO_2$ gas, and the gas such as an N2 gas or a dry air are ejected at a high speed to generate a two-fluid jet flow in which the cleaning liquid is present in the form of minute mist in the gas. The two-fluid jet flow is ejected toward the peripheral portion of the wafer W at a high speed, whereby the foreign matter (dirt) on the peripheral portion of the wafer W is removed by a pressure at the collision of the two-fluid jet flow.

Figure 12A:
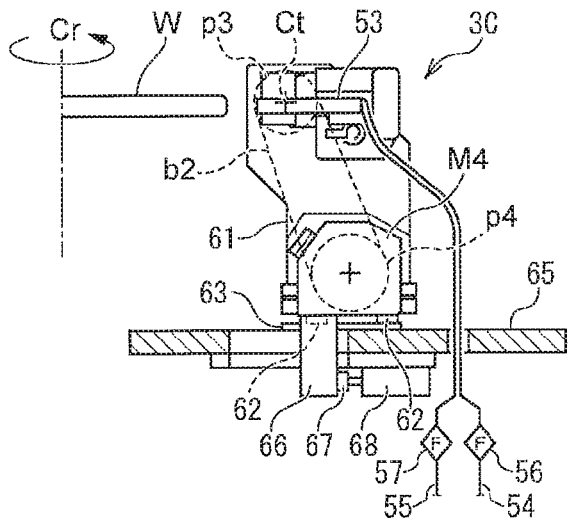
FIGS. 12A, 12B, and 12C are schematic views showing the state in which the cleaning nozzle shown in FIG. 11 cleans the peripheral portion of the wafer.
Figure 12B:
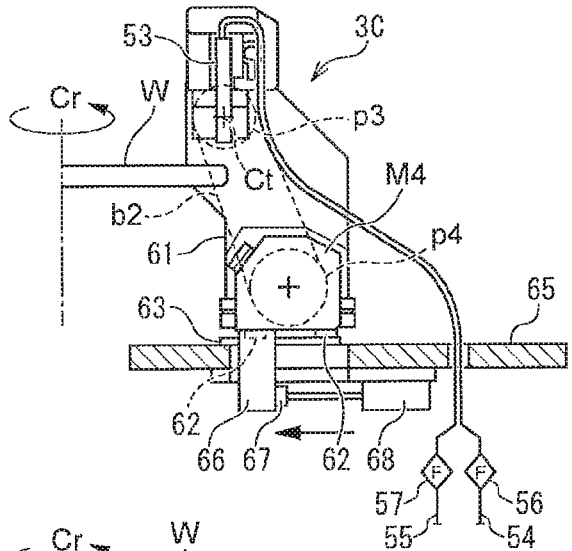
Figure 12C:
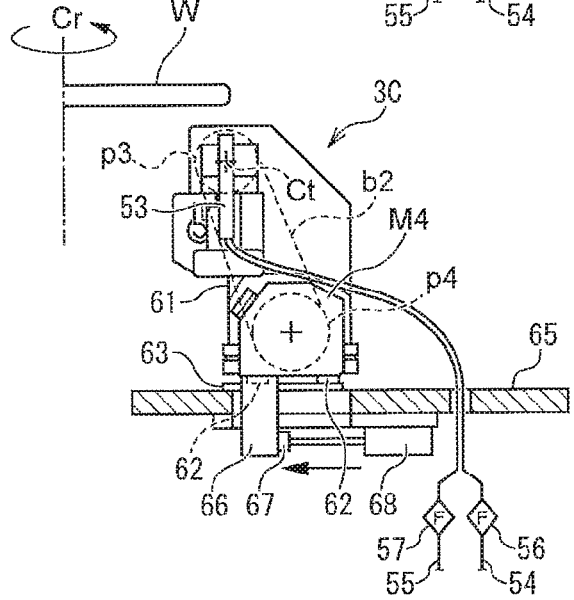

FIGS. 12A, 12B, and 12C are schematic views showing the state where the cleaning nozzle 53 shown in FIG. 11 cleans the peripheral portion of the wafer W.

FIG. 12A shows the state where the cleaning head 3C is moved forward by the linear actuator 67 and the cleaning nozzle 53 cleans the bevel portion of the wafer W. While the wafer W is held and rotated by the substrate holder 2, the two-fluid jet flow is ejected toward the bevel portion of the wafer W from the cleaning nozzle 53 to clean the bevel portion of the wafer W.

FIG. 12B shows the state where the cleaning nozzle 53 is tilted at an angle of +90 degrees by the tilting mechanism in order to eject the two-fluid jet flow toward the top edge portion of the wafer W.

FIG. 12C shows the state where the cleaning nozzle 53 is tilted at an angle of −90 degrees by the tilting mechanism in order to eject the two-fluid jet flow toward the bottom edge portion of the wafer W.

Next, the second head 3D for bringing the tape T having no abrasive grains into contact with the peripheral portion of the wafer W which has been cleaned by the cleaning head 3C and the tape supply and recovery mechanism 10D for supplying and recovering the tape T having no abrasive grains will be described.

The second head 3D is a head for bringing the tape T having no abrasive grains into contact with the peripheral portion of the wafer W in place of the polishing tape PT having abrasive grains, and is functionally identical to the first head 3A. Therefore, the second head 3D has the same structure as the first head 3A as shown in FIGS. 2 and 3, and will not be described in duplication.

Further, the tape supply and recovery mechanism 10D is configured to supply the tape T having no abrasive grains to the second head 3D and to recover the tape T from the second head 3D in place of the polishing tape PT having abrasive grains, and is functionally identical to the tape supply and recovery mechanism 10A. Therefore, the tape supply and recovery mechanism 10D has the same structure as the tape supply and recovery mechanism 10A as shown in FIGS. 2 and 3, and will not be described in duplication.

In the following description, the tape having no abrasive grains will be described. The tape T having no abrasive grains includes a base tape made from PET sheet or the like and a non-woven fabric or a porous layer held on the base tape by a binder (e.g., resin) as an example. The non-woven fabric or the porous layer is brought into contact with the peripheral portion of the wafer W. The non-woven fabric or the porous layer has a large number of concavity and convexity in the surface thereof, and thus has a high removal function of the dirt attached to the peripheral portion of the wafer W.

Figure 13:
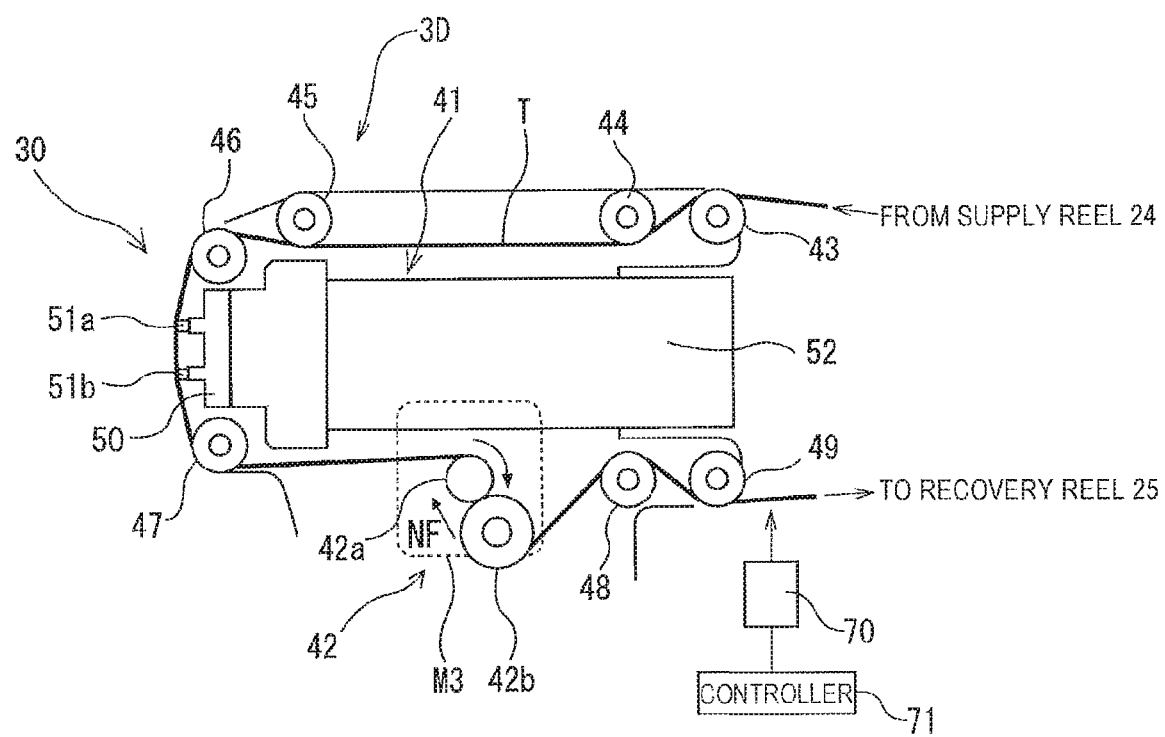
FIG. 13 is an enlarged view of a second head.

FIG. 13 is an enlarged view of the second head 3D. As shown in FIG. 13, the second head 3D has a head body 30 for pressing the tape T having no abrasive grains against the peripheral portion of the wafer W. The head body 30 of the second head 3D is configured to press the tape T having no abrasive grains against the peripheral portion of the wafer W in place of the polishing tape PT having abrasive grains, and is functionally identical to the head body 30 of the first head 3A. Therefore, the head body 30 of the second head 3D has essentially the same structure as the head body 30 of the first head 3A as shown in FIG. 13.

The second head 3D has the same structure as the first head 3A, and further has a configuration for detecting the presence or absence of the dirt attached to the tape T having no abrasive grains after the tape T is brought into contact with the peripheral portion of the wafer W which has been cleaned. Specifically, as shown in FIG. 13, the second head 3D has a sensor 70 configured to apply light to the tape T which has been brought into contact with the peripheral portion of the wafer W after cleaning and to receive reflected light from the tape T. The sensor 70 is configured to receive the reflected light from the tape T and to measure the intensity of the reflected light. Therefore, the tape T having no abrasive grains is preferably made of a material having an absorption rate of light which is not high. The sensor 70 comprises an RGB color sensor, for example. The RGB color sensor is configured to emit white LED light, to separate reflected light into three primary colors of red, green and blue by a filter, and to distinguish a color ratio based on respective intensities of color of red, green and blue by a detection element. The sensor 70 uses an LED capable of emitting light of UV (ultraviolet) region (light of wavelength of 375 nm) as a light source and uses a fluorescence detection UV sensor capable of measuring the intensity of the received light as a light receiving sensor. The sensor 70 is connected to a controller 71. The controller 71 is configured to receive signals from the sensor 70, to compare the intensity of the reflected light received by the sensor 70 with a preset predetermined value, and to judge that dirt is attached to the tape T when the intensity of the reflected light is lower than the predetermined value and thus that the peripheral portion of the wafer W is contaminated with the dirt.

The pressing member 50 of the second head 3D has the same structure as the pressing member 50 of the first head 3A shown in FIGS. 5 through 7, and will not be described in duplication.

Further, the state where the head body 30 of the second head 3D is brought into contact with the peripheral portion of the wafer W is identical to the state where the head body 30 of the first head 3A shown in FIGS. 8 through 10 polishes the peripheral portion of the wafer W except that the polishing tape PT having abrasive grains is replaced with the tape T having no abrasive grains, and will not be described in duplication.

Figure 14:
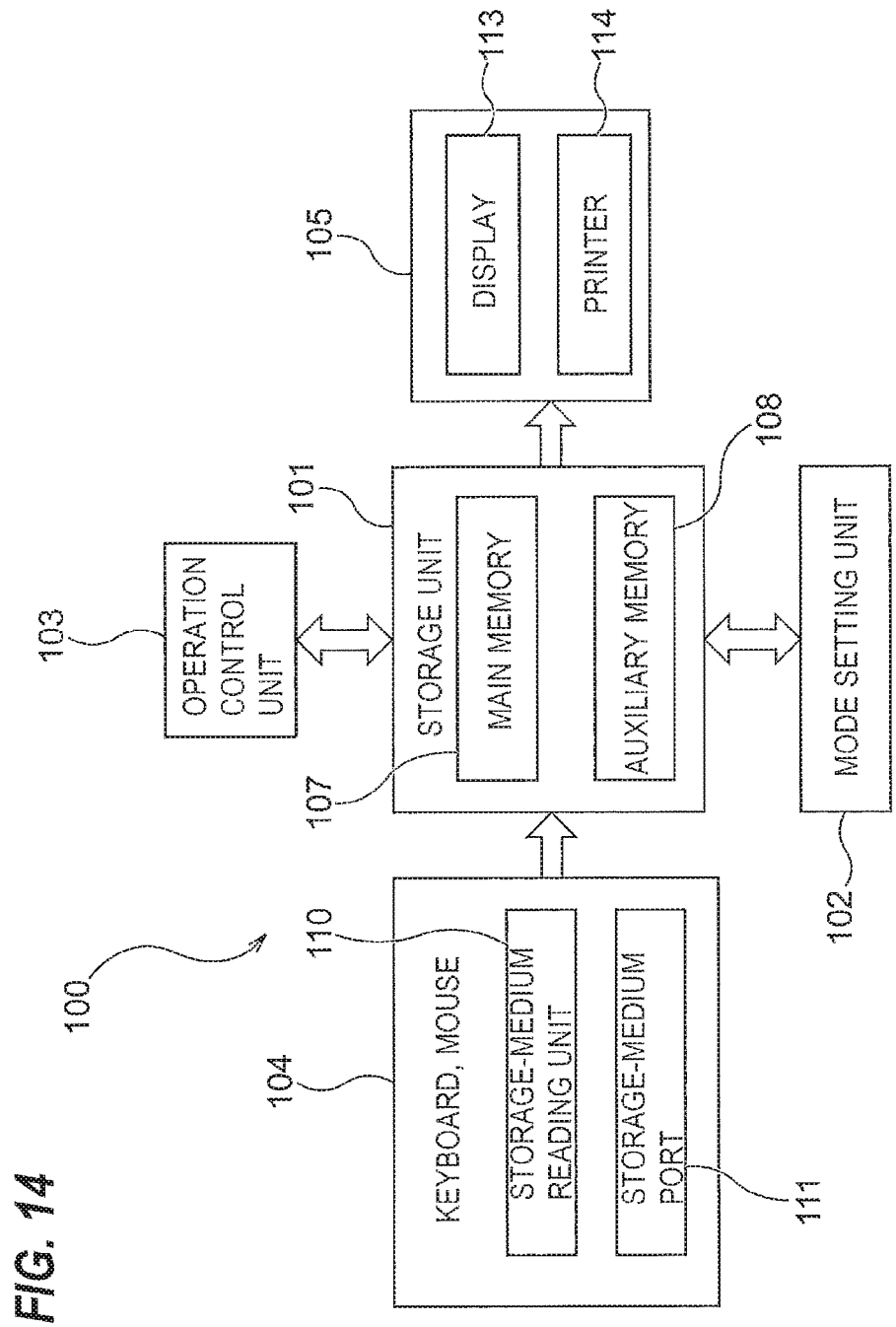
FIG. 14 is a block diagram showing a control device for controlling operation of the substrate processing apparatus configured as shown in FIGS. 2 through 13.

FIG. 14 is a block diagram showing a control device for controlling operation of the substrate processing apparatus configured as shown in FIGS. 2 through 13. The control device comprises a dedicated computer or a generalized computer. As shown in FIG. 14, the control device 100 includes a storage unit 101 configured to store data of a processing recipe for processing the substrate in the substrate processing apparatus 1, a mode setting unit 102 configured to determine an auto mode for setting a processing recipe by retrieving data of the processing recipe from the storage unit 101 with an input of data of the kind of the substrate by an operator or a manual mode for setting a processing recipe by specifying processing conditions with hand by the operator, and an operation control unit 103 for controlling the operation of the substrate processing apparatus based on the set processing recipe. Further, the control device 100 includes an input unit 104 for inputting data, program and various information into the storage unit 101, and an output unit 105 for outputting the processing result and the processed data.

The storage unit 101 includes a main memory 107 which is accessible by the operation control unit 103, and an auxiliary memory 108 that stores the data and the program therein. The main memory 107 may be a random-access memory (RAM), and the auxiliary memory 108 is a storage device which may be a hard disk drive (HDD) or a solid-state drive (SSD).

The input unit 104 includes a keyboard and a mouse, and further includes a storage-medium reading unit 110 for reading the data from a storage medium, and a storage-medium port 111 to which a storage medium can be connected. The storage medium is a non-transitory tangible computer-readable storage medium. Examples of the storage medium include optical disk (e.g., CD-ROM, DVD-ROM) and semiconductor memory (e.g., USB flash drive, memory card). Examples of the storage-medium reading unit 110 include optical disk drive such as CD drive or DVD drive, and card reader. Examples of the storage-medium port 111 include USB terminal. The program and/or the data stored in the storage medium is introduced into the control device 100 via the input unit 104, and is stored in the auxiliary memory 108 of the storage unit 101. The output unit 105 includes a display 113 and a printer 114.

Next, substrate processing steps carried out by the substrate processing apparatus 1 based on the processing recipe stored in the control device 100 shown in FIG. 14 will be described.

First, the peripheral portion of the wafer W is polished by the first heads 3A, 3B. Specifically, the wafer W is held on the holding stage 4 of the substrate holder 2 such that a film (e.g., device layer) formed on the surface of the wafer W faces upward, and the wafer W is rotated about its center.

Then, the polishing liquid (e.g., pure water) is supplied to the wafer W from the upper supply nozzle 36 and the lower supply nozzle 37. When the top edge portion of the wafer W is polished, as shown in FIG. 9, the head body 30 is inclined upward by the tilting mechanism to allow the protrusion 51a to face the top edge portion. While the polishing tape PT is fed in the longitudinal direction of the polishing tape PT by the tap feed mechanism 42, the polishing tape PT is pressed against the top edge portion of the wafer W from above the wafer W by the upper protrusion 51a. In this state, the head body 30 is moved radially outwardly of the wafer W at a constant speed by the linear actuator 67, thereby polishing the top edge portion of the wafer W.

When the bottom edge portion of the wafer W is polished, as shown in FIG. 10, the head body 30 is inclined downward by the tilting mechanism to allow the protrusion 51b to face the bottom edge portion. While the polishing tape PT is fed in the longitudinal direction of the polishing tape PT by the tap feed mechanism 42, the polishing tape PT is pressed against the bottom edge portion of the wafer W from below the wafer W by the protrusion 51b. In this state, the head body 30 is moved radially outwardly of the wafer W at a constant speed by the linear actuator 67, thereby polishing the bottom edge portion of the wafer W. When the bevel portion of the wafer W is polished, as shown in FIG. 8, the polishing tape PT is pressed against the bevel portion of the wafer W by the pressing pad 64 while the inclination angle of the head body 30 is changed continuously by the above-described tilting mechanism. During polishing, the polishing tape PT is fed at a predetermined speed by the tape feed mechanism 42. In this manner, when polishing of the peripheral portion of the wafer W is completed, the head body 30 retreats and thus the polishing tape PT retreats.

Then, the peripheral portion of the wafer W is cleaned by the cleaning head 3C. Specifically, the peripheral portion of the wafer W is cleaned by ejecting the two-fluid jet flow from the cleaning nozzle 53 comprising a two-fluid jet nozzle toward the peripheral portion of the wafer W which is rotated. During this cleaning, as shown in FIGS. 12A, 12B and 12C, the cleaning nozzle 53 is tilted in the range of −90° to +90° by the tilting mechanism. The cleaning nozzle 53 is not limited to the two-fluid jet nozzle, but the cleaning nozzle may comprise a nozzle for supplying ozone water or a cleaning liquid to which megasonic is imparted to the peripheral portion of the wafer W.

The peripheral portion of the wafer W continues to be cleaned for a predetermined time by the cleaning liquid supplied from the cleaning nozzle 53. When cleaning of the peripheral portion of the wafer is completed, the tape T having no abrasive grains is brought into contact with the peripheral portion of the wafer W by the second head 3D. Specifically, while the wafer W is rotated, the tape T comprising the base tape and the non-woven fabric or the porous layer and having no abrasive grains is brought into contact with the peripheral portion of the wafer W. At this time, as shown in FIGS. 8 through 10, the head body 30 is tilted by the tilting mechanism, and the tape T having no abrasive grains is brought into contact with the bevel portion, the top edge portion, and the bottom edge portion of the wafer W. When dirt is attached to the peripheral portion of the wafer W, the dirt is attached to the tape T by the contact of the tape T with the peripheral portion of the wafer W, and the tape T to which the dirt is attached is rewound by the recovery reel 25. During this recovery of the tape T, light is applied from the sensor 70 to the tape T, and reflected light from the tape T is received by the sensor 70. The sensor 70 measures the intensity of the reflected light received by the sensor 70.

The sensor 70 transmits signals representing the intensities of the reflected light to the controller 71. The controller 71 compares the intensity of the reflected light received by the sensor 70 with a preset predetermined value, and judges that dirt is attached to the tape T when the intensity of the reflected light is lower than the predetermined value and thus that the peripheral portion of the wafer W is contaminated with the dirt. The controller 71 judges that dirt is not attached to the tape T when the intensity of the reflected light is higher than the predetermined value and thus that the peripheral portion of the wafer W is not contaminated with the dirt. The wafer W which has been judged to be uncontaminated is transferred to a subsequent process. In the subsequent process, the entire surface of the wafer W is cleaned by using a cleaning device, and then the wafer W is dried by using a drier after cleaning.

On the other hand, when it is judged that the peripheral portion of the wafer W is contaminated, the peripheral portion of the wafer W is cleaned again by the cleaning head 3C. Specifically, the peripheral portion of the wafer W is cleaned again by ejecting the two-fluid jet flow from the cleaning nozzle 53 toward the peripheral portion of the wafer W which is rotated. Then, the contact process for bringing the tape T into contact with the peripheral portion of the wafer W by the second head 3D, the detecting process of the dirt by the sensor 70, and the judgement process of the dirt by the controller 70 are carried out once again.

Next, the operation procedure of the cleaning nozzle 53 comprising the two-fluid jet nozzle will be described with reference to FIGS. 15 and 16.

Figure 15:
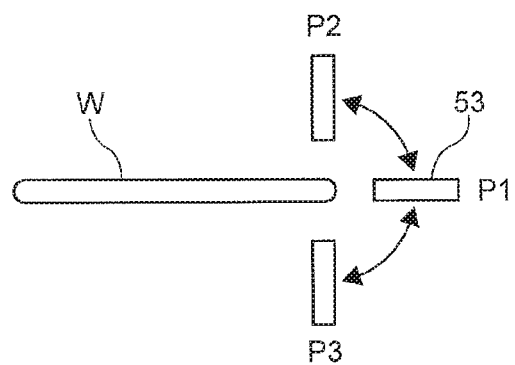
FIG. 15 is a schematic view showing three positions of the cleaning nozzle with respect to the wafer.

FIG. 15 is a schematic view showing three positions of the cleaning nozzle 53 with respect to the wafer W. The cleaning nozzle 53 is tilted between P1 as a position of 0°, P2 as a position of +90°, and P3 as a position of −90°, and ejects the two-fluid jet flow toward the peripheral portion of the wafer W at the respective positions P1, P2 and P3 and between the respective positions. As an operational example, first, the cleaning nozzle 53 ejects the two-fluid jet flow from the 0° direction at the position of P. Then, the cleaning nozzle 53 ejects the two-fluid jet flow from the 90° direction at the position of P2. Thereafter, the cleaning nozzle 53 is gradually tilted toward the 0° direction, and the cleaning nozzle 53 is tilted to the −90° direction after the inclination angle becomes 0°, and then the cleaning nozzle 53 ejects the two-fluid jet flow from the −90° direction at the position of P3. The cleaning nozzle 53 continues to eject the two-fluid jet flow even in the tilting motion.

Because the peripheral portion of the wafer W after polishing varies in the degree of dirt according to the polishing method in some cases, a recipe in which the dirtiest place is initially cleaned and then other places are cleaned in the cleaning head 3C is set. For example, in the case where the first head 3A and/or 3B polishes the top edge portion of the wafer W the cleaning nozzle 53 of the cleaning head 3C initially cleans the top edge portion of the wafer W and then cleans the bevel portion and/or the bottom edge portion of the wafer W. Further, with respect to cleaning time, the cleaning time of the top edge portion is longer than that of other places.

Figure 16A:
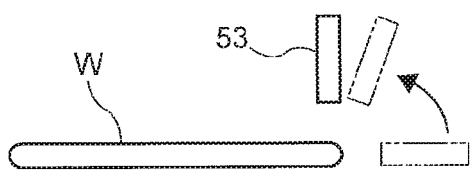
FIGS. 16A, 16B and 16C are schematic views showing an example in which the cleaning nozzle of the cleaning head initially cleans the top edge portion of the wafer and then cleans the bevel portion and/or the bottom edge portion.
Figure 16B:
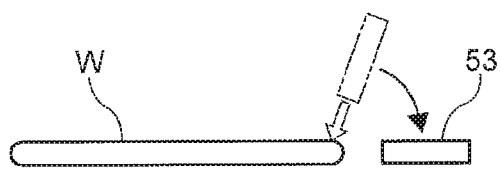
Figure 16C:
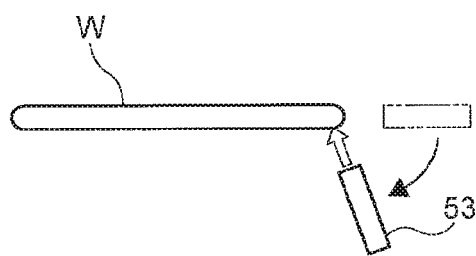

FIGS. 16A, 16B and 16C are schematic views showing an example in which the cleaning nozzle 53 of the cleaning head 3C initially cleans the top edge portion of the wafer W and then cleans the bevel portion and/or the bottom edge portion.

As an example of the operation, as shown in FIG. 16A, the cleaning nozzle 53 is moved from the position of 0° to the position of +90°, and the cleaning nozzle 53 ejects the two-fluid jet flow at the position of +90° toward the top edge portion of the wafer W, thereby cleaning the top edge portion of the wafer W first. Then, as shown in FIG. 16B, while the cleaning nozzle 53 is gradually moved in a downward direction toward the position of 0°, the cleaning nozzle 53 ejects the two-fluid jet flow to clean the wafer W from the top edge portion to the bevel portion. Then, as shown in FIG. 16C, while the cleaning nozzle 53 is moved quickly in a downward direction to the position of −90°, the cleaning nozzle 53 ejects the two-fluid jet flow to clean the wafer W from the bevel portion to the bottom edge portion.

Alternatively, the cleaning process of the top edge portion (corresponding to FIG. 16A in the drawings) and the cleaning process of the bottom edge portion (corresponding to FIG. 16C in the drawings) may be carried out, and the process for cleaning the wafer W from the position where the inclination angle of the cleaning nozzle 53 is 0° (corresponding to FIG. 16B in the drawings) may not be carried out. In this manner, the peripheral portion of the substrate can be locally cleaned, and the effect in which the device surface (pattern surface) of the substrate is damaged by cleaning (for example, collapse of pattern) can be prevented from occurring. In addition to the above configuration, if pure water (DIW) or the like is supplied from a nozzle (not shown) at the position of 0° after cleaning of the top edge portion and the bottom edge portion is completed, the bevel portion of the substrate can be cleaned more reliably.

Furthermore, in order to prevent reattachment of the foreign matter removed from the substrate to the substrate when the foreign matter attached to the top edge portion of the substrate is cleaned, a modified embodiment in which the movable range of the cleaning nozzle 53 for ejecting the two-fluid jet flow at the top edge side is expanded by about 10 to 15° from the movable range of +90° to −90°, for example, to the movable range of +100° to −90° may be conceived.

Alternatively, in order to prevent reattachment of the foreign matter removed from the substrate to the substrate when the foreign matter attached to the bottom edge portion of the substrate is cleaned, a modified embodiment in which the movable range of the cleaning nozzle 53 for ejecting the two-fluid jet flow at the bottom edge side is expanded by about 1° to 15° from the movable range of +90° to −90°, for example, to the movable range of +90° to −100° may be conceived.

Alternatively, by providing a shielding member (not shown) above and/or below the substrate in the central side of the substrate with respect to the cleaning nozzle 53, reattachment of the foreign matter removed from the substrate to the substrate when the foreign matter attached to the peripheral portion of the substrate is cleaned can be prevented.

Alternatively, an exhaust amount of a fan mechanism (not shown) which communicates with an exhaust port of a lower surface of the substrate processing apparatus can be increased during cleaning process so that an airflow of down flow formed in a housing of the substrate processing apparatus is further intensified at the time of cleaning the substrate. Thus, droplets of the cleaning liquid removed by cleaning can be prevented from floating in the air and from being reattached to the substrate more effectively.

Further, as an example of operation, in the case where the first head 3A and/or 3B polishes the bottom edge portion of the wafer W, the cleaning nozzle 53 of the cleaning head 3C initially cleans the bottom edge portion of the wafer W and then cleans the bevel portion and/or the top edge portion of the wafer W. Further, with respect to cleaning time, the cleaning time of the bottom edge portion is longer than that of other places.

Further, in the case where the first head 3A and/or 3B polishes the bevel portion of the wafer W, the cleaning nozzle 53 of the cleaning head 3C initially cleans the bevel portion of the wafer W and then cleans the top edge portion and/or the bottom edge portion of the wafer W. Further, with respect to cleaning time, the cleaning time of the bevel portion is longer than that of other places.

By these measures, the foreign matter attached to the peripheral portion of the substrate can be removed more successfully.

Although the embodiments of the present invention have been described above, it should be understood that the present invention is not limited to the above embodiments, but various changes and modifications may be made to the embodiments without departing from the scope of the appended claims. For example, the present invention can be applied to an apparatus which can include a process for processing a peripheral portion of a substrate using a polishing tape having abrasive grains. More specifically, the present invention can be applied to a polishing apparatus for polishing a surface or a rear surface of a substrate, a polishing apparatus for polishing an end portion of a substrate (referred also to as an edge polishing apparatus), a substrate grinding apparatus, and a substrate thinning apparatus or the like. Further, as an aspect of a modified embodiment, the present invention can be applied to a substrate polishing apparatus for polishing a peripheral portion of a substrate using a polishing tool containing abrasive grains in place of the polishing tape containing abrasive grains.

What is claimed is:

1. A substrate processing method comprising:
   holding a substrate and rotating the substrate by a substrate holder;
   polishing a peripheral portion of the substrate by pressing a polishing tape having abrasive grains against the peripheral portion of the substrate with a first head;
   cleaning the peripheral portion of the substrate by supplying a cleaning liquid from a cleaning nozzle to the peripheral portion of the substrate which has been polished;
   bringing a tape having no abrasive grains into contact with the peripheral portion of the substrate which has been cleaned, by a second head;
   applying light to the tape which has been brought into contact with the peripheral portion of the substrate and receiving reflected light from the tape by a sensor; and
   judging that the peripheral portion of the substrate is contaminated when an intensity of the received reflected light is lower than a predetermined value.

2. The substrate processing method according to claim 1, wherein the tape having no abrasive grains comprises a base tape and a non-woven fabric or a porous layer held on the base tape, and the non-woven fabric or the porous layer is brought into contact with the peripheral portion of the substrate.

3. The substrate processing method according to claim 1, wherein the cleaning nozzle comprises a two-fluid jet nozzle, and a mixed fluid of a liquid and a gas is supplied to the peripheral portion of the substrate to clean the peripheral portion of the substrate by the two-fluid jet nozzle.

4. The substrate processing method according to claim 1, wherein ozone water or a cleaning liquid is supplied to the peripheral portion of the substrate to clean the peripheral portion of the substrate by the cleaning nozzle.

5. The substrate processing method according to claim 1, wherein in response to a determination that the peripheral portion of the substrate is contaminated, the peripheral portion of the substrate is cleaned again.

* * * * *